(12) United States Patent
Uchida et al.

(10) Patent No.: US 11,649,540 B2
(45) Date of Patent: May 16, 2023

(54) DEPOSITION MASK AND METHOD OF MANUFACTURING DEPOSITION MASK

(71) Applicant: Dai Nippon Printing Co., Ltd., Tokyo (JP)

(72) Inventors: Yasuhiro Uchida, Tokyo (JP); Sachiyo Matsuura, Tokyo (JP); Chikao Ikenaga, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 17/305,731

(22) Filed: Jul. 14, 2021

(65) Prior Publication Data

US 2021/0340665 A1 Nov. 4, 2021

Related U.S. Application Data

(60) Division of application No. 16/512,697, filed on Jul. 16, 2019, now Pat. No. 11,136,664, which is a
(Continued)

(30) Foreign Application Priority Data

Jan. 17, 2017 (JP) .............................. JP2017-005999
Dec. 13, 2017 (JP) .............................. JP2017-238989

(51) Int. Cl.
*C23C 14/04* (2006.01)
*C23F 1/02* (2006.01)
(Continued)

(52) U.S. Cl.
CPC .............. *C23C 14/042* (2013.01); *C23F 1/02* (2013.01); *H01L 51/0011* (2013.01); *H01L 51/56* (2013.01); *B05C 21/005* (2013.01)

(58) Field of Classification Search
None
See application file for complete search history.

(56) References Cited

U.S. PATENT DOCUMENTS 6,955,726 B2 10/2005 Kang et al.
2003/0221614 A1 12/2003 Kang et al.
(Continued)

FOREIGN PATENT DOCUMENTS

CN 102131949 A 7/2011
CN 103149790 A 6/2013
(Continued)

OTHER PUBLICATIONS

International Search Report and Written Opinion (Application No. PCT/JP2017/046689) dated Apr. 10, 2018.
(Continued)

*Primary Examiner* — Binu Thomas
(74) *Attorney, Agent, or Firm* — Burr Patent Law, PLLC

(57) ABSTRACT

A deposition mask includes: a first surface and a second surface, in which a plurality of through-holes are formed; a pair of long side surfaces connected to the first and second surfaces, and defining a profile of the deposition mask in a longitudinal direction of the deposition mask; and a pair of short side surfaces connected to the first and second surfaces, and defining a profile of the deposition mask in a width direction of the deposition mask. The long side surface includes a first portion that is recessed inside and includes a first end portion positioned along the first surface, and a second end portion positioned along the second surface and positioned inside the first end portion. The through-hole includes a first recess formed on the first surface, and a second recess formed on the second surface and connected to the first recess through a hole connection portion.

9 Claims, 18 Drawing Sheets

Related U.S. Application Data continuation of application No. PCT/JP2017/046689, filed on Dec. 26, 2017.

(51) Int. Cl.
  *H01L 51/00* (2006.01)
  *H01L 51/56* (2006.01)
  *B05C 21/00* (2006.01)

(56) References Cited

U.S. PATENT DOCUMENTS

| | | |
|---|---|---|
| 2011/0168087 A1 | 7/2011 | Lee et al. |
| 2011/0179996 A1 | 7/2011 | Park et al. |
| 2011/0207261 A1 | 8/2011 | Watai et al. |
| 2014/0150721 A1 | 6/2014 | Oh et al. |
| 2014/0331925 A1 | 11/2014 | Han |
| 2015/0177611 A1 | 6/2015 | Li |
| 2015/0194762 A1 | 7/2015 | Fukuda et al. |
| 2016/0237546 A1 | 8/2016 | Ikenaga et al. |
| 2017/0069843 A1 | 3/2017 | Kang et al. |

FOREIGN PATENT DOCUMENTS

| | | | |
|---|---|---|---|
| JP | S63-255380 | A1 | 10/1988 |
| JP | 2004-014513 | A1 | 1/2004 |
| JP | 2007-311257 | A1 | 11/2007 |
| JP | 2013-110072 | A1 | 6/2013 |
| JP | 5382259 | B1 | 1/2014 |
| JP | 2014-148743 | A1 | 8/2014 |
| JP | 2015-046427 | A1 | 3/2015 |
| JP | 2016-113668 | A | 6/2016 |
| KR | 10-2015-0063442 | A | 6/2015 |
| WO | 2015/056537 | A1 | 4/2015 |

OTHER PUBLICATIONS

Japanese Office Action (Application No. 2017-238989) dated Jul. 13, 2018 (with English translation).
Japanese Office Action (Application No. 2017-238989) dated Aug. 21, 2018 (with English translation).
English Translation of International Preliminary Report on Patentability (Chapter I) (Application No. PCT/JP2017/046689) dated Aug. 1, 2019.
Chinese Office Action (Application No. 201910813046,8) dated Mar. 20, 2020 (with English translation).
Japanese Office Action (Application No. 2018-182841) dated Nov. 16, 2021 (with English translation).
Korean Office Action (Application No. 2022-7039061) dated Dec. 22, 2022 (with English translation).

DEPOSITION MASK AND METHOD OF MANUFACTURING DEPOSITION MASK

CROSS REFERENCE TO RELATED APPLICATIONS

This application is a division of U.S. application Ser. No. 16/512,697, filed Jul. 16, 2019, which is a continuation of International Application No. PCT/JP2017/046689, filed Dec. 26, 2017, which claims the benefit of priority from Japanese Patent Application No. 2017-005999, filed Jan. 17, 2017, and Japanese Patent Application No. 2017-238989, filed Dec. 13, 2017. The entire contents of these applications are incorporated herein by reference.

FIELD OF THE INVENTION

The embodiments of the disclosure relate to a deposition mask and a manufacturing method of a deposition mask.

BACKGROUND OF THE INVENTION

A display device used in a portable device such as a smart phone and a tablet PC has been recently required to have high fineness, e.g., a pixel density of equal to or more than 400 ppi. In addition, there is increasing demand that the portable device is applicable in the full high-definitions reference. In this case, the pixel density of the display device needs to be equal to or more than 800 ppi, for example.

An organic EL display device draws attention because of its excellent responsibility and low power consumption. A known method for forming pixels of an organic EL display device is a method which uses a deposition mask including through-holes that are arranged in a desired pattern, and forms pixels in the desired pattern. To be specific, a deposition mask is firstly brought into tight contact with a substrate for organic EL display device, and then the substrate and the deposition mask in tight contact therewith are put into a deposition apparatus so as to perform a deposition step in which an organic material is deposited on the substrate. Thus, pixels containing an organic material can be formed on the substrate in a pattern corresponding to the pattern of the through-holes of the ₊deposition mask.

As described in JP5382259B, for example, in the deposition step, the deposition mask is fixed on a frame having a predetermined rigidity. For example, when the deposition mask includes a pair of long side surfaces and a pair of short side surfaces, the deposition mask is fixed on the frame, such that the deposition mask is pulled in the long side direction. Thus, warp of the deposition mask is prevented, while a dimensional precision and a positional precision of pixels can be increased.

SUMMARY OF THE INVENTION

One of the factors deciding a positional precision of pixels to be formed on a substrate may be a positional precision of a deposition mask with respect to a substrate or a frame. As a reference position of a deposition mask upon positioning, an outer profile of the deposition mask can be used, for example. A position of the profile of the deposition mask can be detected by photographing the deposition mask with the use of a camera, for example.

In a step of detecting the position of the profile of the deposition mask based on an image photographed by using a camera or the like, it is preferable that a boundary between a deposition mask area and another area is clearly displayed on the image. However, when scattering of light occurs in a portion defining the profile of the deposition mask, the boundary between the deposition mask area and another area gets blurred in the image.

The object of the embodiments of the disclosure is to provide a deposition mask and a method of manufacturing a deposition mask, which are capable of effectively solving such a problem.

A first embodiment of the disclosure is a deposition mask in which a plurality of through-holes are formed, comprising: a first surface and a second surface, in which the plurality of through-holes are formed; a pair of long side surfaces connected to the first surface and the second surface, and defining a profile of the deposition mask in a longitudinal direction of the deposition mask; and a pair of short side surfaces connected to the first surface and the second surface, and defining a profile of the deposition mask in a width direction of the deposition mask, wherein: the long side surface includes a first portion that is recessed inside, the first portion including a first end portion positioned along the first surface, and a second end portion positioned along the second surface and positioned inside the first end portion; the through-hole includes a first recess formed on the first surface, and a second recess formed on the second surface and connected to the first recess through a hole connection portion; and the first end portion of the first portion of the long side surface is positioned closer to the first surface than the hole connection portion. The first end portion may correspond to a first connection portion to which the first surface and the long side surface are connected, the first connection portion being positioned at a same plane with the first surface. Alternatively, the first end portion may be positioned outside a first connection portion to which the first surface and the long side surface are connected, the first connection portion being positioned at a same plane with the first surface.

A second embodiment of the disclosure is a deposition mask in which a plurality of through-holes are formed, comprising: a first surface and a second surface, in which the plurality of through-holes are formed; a pair of long side surfaces connected to the first surface and the second surface, and defining a profile of the deposition mask in a longitudinal direction of the deposition mask; and a pair of short side surfaces connected to the first surface and the second surface, and defining a profile of the deposition mask in a width direction of the deposition mask; wherein: the long side includes a first portion that is recessed inside, the first position including a first end portion positioned along the first surface, and a second end portion positioned along the second surface and positioned inside the first end portion; and the first end portion corresponds to a first connection portion to which the first surface and the long side surface are connected, the first connection portion being positioned at a same plane with the first surface.

In the deposition mask according to the first embodiment or the second embodiment of the disclosure, a distance between a first connection portion and the first end portion of the first portion of the long side surface in a plane direction of the first surface may be equal to or less than 3.5 μm, the first connection portion being positioned at a same plane with the first surface and connecting the first surface and the long side surface.

In the deposition mask according to the first embodiment or the second embodiment of the disclosure, the first portion may be positioned inside a virtual plane or line, the virtual plane or line passing the first end portion and the second end portion.

In the deposition mask according to the first embodiment or the second embodiment of the disclosure, a thickness of the deposition mask may be equal to or less than 50 μM.

In the deposition mask according to the first embodiment or the second embodiment of the disclosure, the second end portion may correspond to a second connection portion to which the second surface and the long side surface are connected, the second connection portion being positioned at a same plane with the second surface.

A third embodiment of the disclosure is a manufacturing method of a deposition mask in which a plurality of through-holes are formed, comprising: a step of preparing a metal plate including a first surface and a second surface opposite to the first surface; and a processing step of processing the metal plate to obtain the deposition mask which includes a first surface and a second surface in which the plurality of through-holes are formed, a pair of long side surfaces connected to the first surface and the second surface, and defining a profile of the deposition mask in a longitudinal direction of the deposition mask, and a pair of short side surfaces connected to the first surface and the second surface, and defining a profile of the deposition mask in a width direction of the deposition mask; wherein: the long side surface includes a first portion that is recessed inside, the first portion including a first end portion positioned along the first surface, and a second end portion positioned along the second surface and positioned inside the first end portion; the through-hole includes a first recess formed on the first surface, and a second recess formed on the second surface and connected to the first recess through a hole connection portion; and the first end portion of the first portion of the long side surface is positioned closer to the first surface than the hole connection portion. The processing step may include a second-surface etching step of etching the metal plate along the second surface so as to form the first portion of the long side surface, and the second-surface etching step may be performed such that the first end portion of the first portion corresponds to a first connection portion to which the first surface and the long side surface are connected, the first connection portion being positioned at a same plane with the first surface. Alternatively, the processing step may include a first-surface etching step of etching the metal plate along the first surface so as to form a second portion of the long side surface; and a second-surface etching step of etching the metal plate along the second surface so as to form the first portion of the long side surface, the second portion being positioned between the first end portion of the first portion of the long side surface and the first surface of the metal plate.

A fourth embodiment of the disclosure is a manufacturing method of a deposition mask in which a plurality of through-holes are formed, comprising: a step of preparing a metal plate including a first surface and a second surface opposite to the first surface; and a processing step of processing the metal plate to obtain the deposition mask which includes a first surface and a second surface in which the plurality of through-holes are formed, a pair of long side surfaces connected to the first surface and the second surface, and defining a profile of the deposition mask in a longitudinal direction of the deposition mask, and a pair of short side surfaces connected to the first surface and the second surface, and defining a profile of the deposition mask in a width direction of the deposition mask; wherein: the long side surface includes a first portion that is recessed inside, the first portion including a first end portion positioned along the first surface, and a second end portion positioned along the second surface and positioned inside the first end portion; the processing step includes a second-surface etching step of etching the metal plate along the second surface so as to form the first portion of the long side surface; and the second-surface etching step is performed such that the first end portion of the first portion corresponds to a first connection portion to which the first surface and the long side surface are connected, the first connection portion being positioned at a same plane with the first surface.

In the manufacturing method of the deposition mask according to the third embodiment or the fourth embodiment of the disclosure, a distance between a first connection portion and the first end portion of the first portion of the long side surface in a plane direction of the first surface may be equal to or less than 3.5 the first connection portion being positioned at a same plane with the first surface and connecting the first surface and the long side surface.

According to the embodiments of the disclosure, the profile of the deposition mask can be precisely detected.

BRIEF DESCRIPTION OF THE DRA. INGS

DETAILED DESCRIPTION OF THE INVENTION

Figure 1:
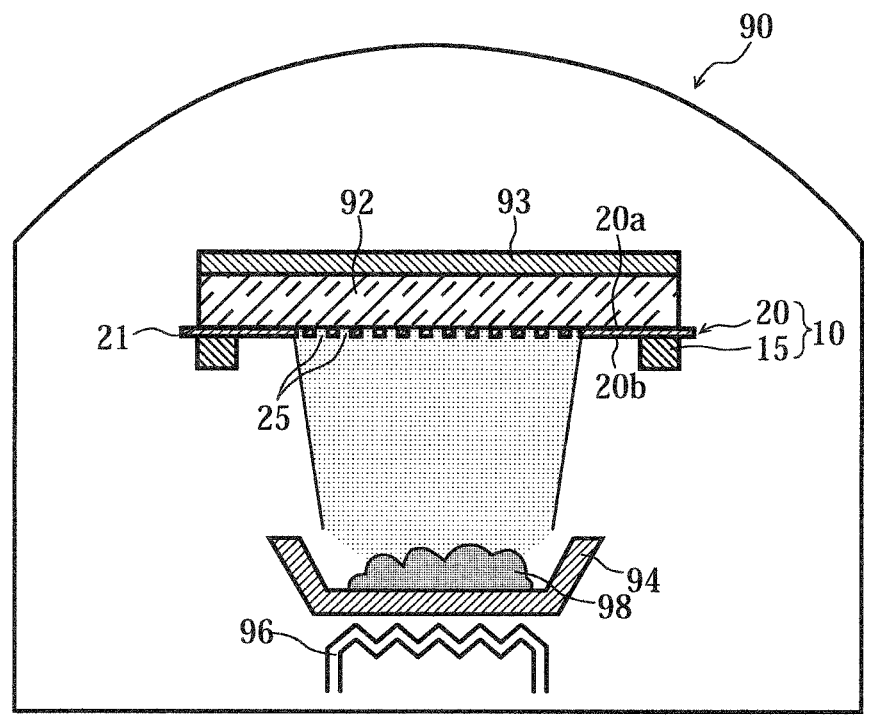
FIG. 1 is a view showing a deposition apparatus comprising a deposition mask apparatus according to an embodiment of the disclosure.

An embodiment of the disclosure will be described herebelow with reference to the drawings. In the drawings attached to the specification, a scale dimension, an aspect ratio and so on are changed and exaggerated from the actual ones, for the convenience of easiness in illustration and understanding.

FIGS. 1 to 25 are views for describing an embodiment of the disclosure. In the below embodiment and the modification example, a manufacturing method of a deposition mask, which is used for patterning an organic material on a substrate in a desired pattern when an organic EL display device is manufactured, is described by way of example. However, not limited thereto, the disclosure can be applied to a manufacturing method for a deposition mask for various uses.

In this specification, terms "plate", "sheet" and "film" are not differentiated from one another based only on the difference of terms. For example, the "plate" is a concept including a member that can be referred to as sheet or film.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions and their degrees, e.g., "parallel", "orthogonal", "same", "similar" etc., and values of a length, an angle and a physical property are not limited to their strict definitions, but construed to include a range capable of exerting a similar function.

Firstly, a deposition apparatus 90 that performs a deposition process in which a deposition material is deposited on an object is described with reference to FIG. 1. As shown in FIG. 1, the deposition apparatus 90 includes therein a deposition source (e.g., crucible 94), a heater 96, and a deposition mask apparatus 10. The deposition apparatus 90 further includes exhaust means for exhausting an inside of the deposition apparatus 90 into a vacuum atmosphere. The crucible 94 accommodates a deposition material 98 such as an organic luminescence material. The heater 96 heats the crucible 94 to evaporate the deposition material 98 under vacuum atmosphere. The deposition mask apparatus 10 is disposed oppositely to the crucible 94.

Herebelow, the deposition mask apparatus 10 is described. As shown in FIG. 1, the deposition mask apparatus 10 includes a deposition mask 20, and a frame 15 supporting the deposition mask 20. The frame 15 supports the deposition mask 20 in such a manner that the deposition mask 20 is tensed in its plane direction, in order that the deposition mask 20 is not warped. As shown in FIG. 1, the deposition mask apparatus 10 is disposed in the deposition apparatus 90 such that the deposition mask 20 faces a substrate to which the deposition material 98 is to be deposited, such as an organic EL substrate 92. In the description below, a surface of the deposition mask 20, which is on the side of the organic EL substrate 92, is referred to as a first surface 20a, and a surface positioned oppositely to the first surface 20a is referred to as a second surface 20b, but the present invention is not limited thereto.

As shown in FIG. 1, the deposition mask apparatus 10 may include a magnet 93 located on a surface of the organic EL substrate 93, which surface is opposed to the deposition mask 20. Due to the provision of the magnet 93, the deposition mask 20 can be drawn toward the magnet 93 by a magnetic force, so that the deposition mask 20 can be brought into tight contact with the organic EL substrate 92. Thus, generation of shadow in a deposition step can be prevented, whereby a dimensional precision and a positional precision of the deposition material 98 with respect to the EL substrate 92 can be improved.

Figure 3:
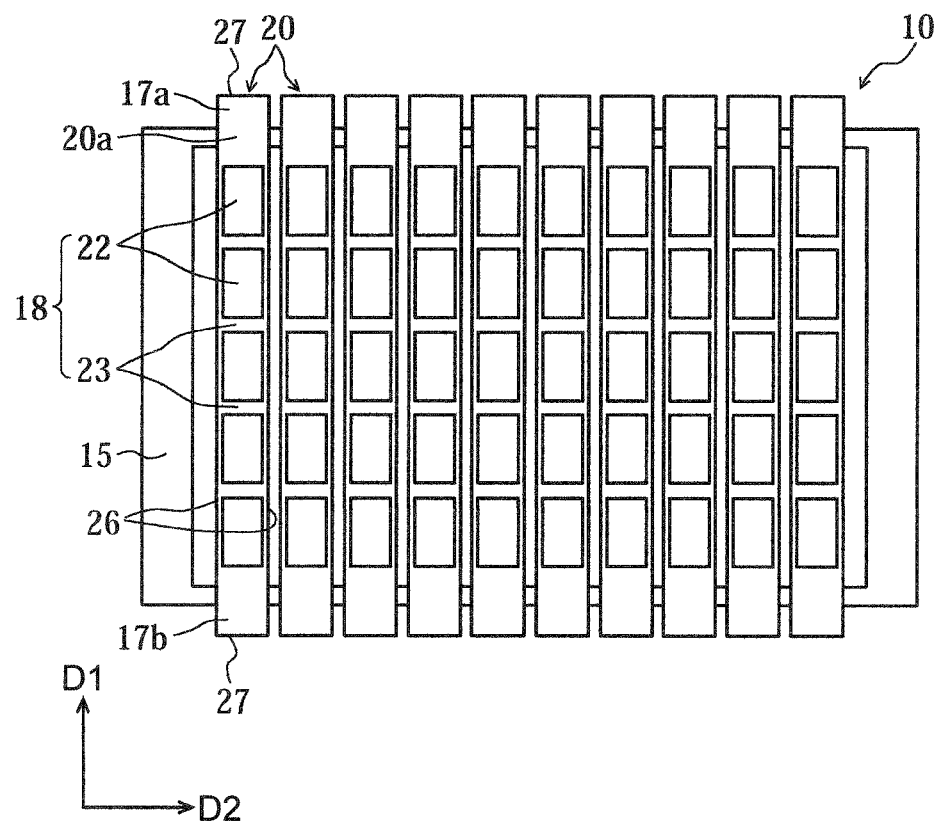
FIG. 3 is a plan view showing the deposition mask apparatus according to the embodiment of the disclosure.

FIG. 3 is a plan view of the deposition mask apparatus 10, when seen from the side of the first surface 20a of the deposition mask 20. As shown in FIG. 3, the deposition mask apparatus 10 includes a plurality of deposition masks 20. In this embodiment, each deposition mask 20 includes a rectangular shape extending in a longitudinal direction D1. In the deposition mask apparatus 10, the deposition masks 20 are arranged side by side in a width direction D2 intersecting the longitudinal direction D1 of the deposition masks 20. Each deposition mask 20 is fixed on the frame 15 by welding, for example, at both ends of the deposition mask 20 in the longitudinal direction D1.

Figure 4:
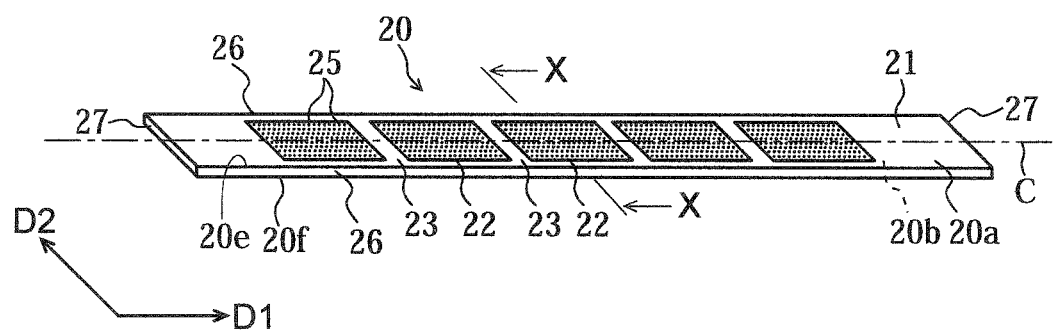
FIG. 4 is a perspective view showing a deposition mask.

FIG. 4 is perspective view showing the deposition mask 20. The deposition mask 20 comprises metal plate-like base member 21, and a plurality of through-holes 25 passing through the base member 21. The deposition material 98, which includes evaporated from the crucible 94 to reach the deposition mask apparatus 10, passes through the through-holes 25 of the deposition mask 20 to adhere to the organic EL substrate 92. Thus, the organic material 98 can be deposited on the surface of the organic EL substrate 92 in a desired pattern corresponding to the positions of the through-holes 25 of the deposition mask.

Figure 2:
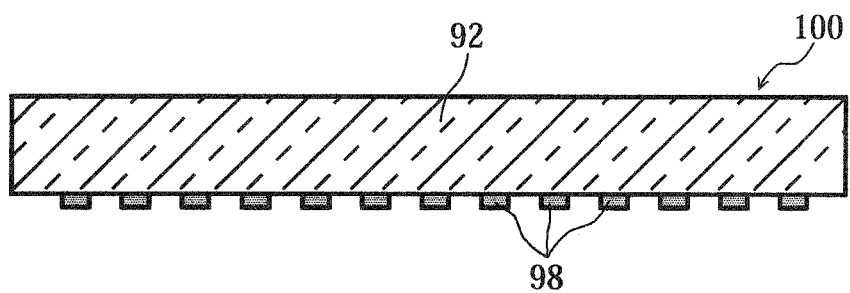
FIG. 2 is a sectional view showing an organic EL display device manufactured by using the deposition mask apparatus shown in FIG. 1.

FIG. 2 is a sectional view showing an organic EL display device 100 manufactured by using the deposition apparatus of FIG. 1. The organic EL display device 100 includes the organic EL substrate 92, and pixels containing the patterned deposition material 98.

When colored display by a plurality of colors is desired, the deposition apparatuses 90 provided with deposition masks corresponding to respective colors are respectively prepared, and the organic EL substrate 92 is put into the respective deposition apparatuses 90 in sequence. Thus, for example an organic luminescence material for red color, an organic luminescence material for green color, and an organic luminescence material for blue color can be deposited onto the organic EL substrate 92 in sequence.

The deposition process is sometimes performed inside the deposition apparatus 90 in a high-temperature atmosphere. In this case, during the deposition process, the deposition masks 20, the frame 15 and the organic EL substrate 92, which are held inside the deposition apparatus 90, are also heated. At this time, each of deposition mask 20, the frame 15 and the organic EL substrate 92 develop dimensional change behaviors based on their respective thermal expansion coefficients. In this case, when the thermal expansion coefficients of the deposition mask 20, the frame 15 and the organic EL substrate 92 largely differ from one another, positioning displacement occurs because of the difference in dimensional change. As a result, the dimensional precision and the positional precision of the deposition material to be adhered to the organic EL substrate 92 lower.

In order to avoid this problem, the thermal expansion coefficients of the deposition mask 20 and the frame 15 are preferably equivalent to the thermal expansion coefficient of the organic EL substrate 92. For example, when a glass substrate is used as the organic EL substrate 92, an iron alloy containing nickel can be used as a main material of the deposition mask 20 and the frame 15. For example, an iron alloy containing equal to or more than 30% by mass and equal to or less than 54% by mass of nickel can be used as a material of the substrate constituting the deposition masks 20. Concrete examples of an iron alloy containing nickel may be an invar material containing equal to or more than 34% by mass and equal to or less than 38% by mass of nickel, a super invar material containing cobalt in addition to equal to or more than 30% by mass and equal to or less than 34% by mass of nickel, or a low thermal expansion Fe—Ni based plated alloy containing equal to or more than 38% by mass and equal to or less than 54% by mass of nickel.

During the deposition step, if the deposition mask 20, the frame 15 and the organic EL substrate 92 do not reach high temperatures, it is not particularly necessary that the thermal expansion coefficients of the deposition mask 20 and the frame 15 are equivalent to the thermal expansion coefficient of the organic EL substrate 92. In this case, a material other than the aforementioned iron alloy can be used as a material for forming the deposition mask 20. For example, it is possible to use an iron alloy other than the iron alloy containing nickel, such as an iron alloy containing chrome. As an iron alloy containing chrome, an iron alloy that is so-called stainless can be used, for example. In addition, it is possible to use alloy other than an iron alloy, such as nickel, or nickel-cobalt alloy.

Next, the deposition mask 20 is described in detail. An outer contour of the deposition mask 20 is firstly described. As shown in FIGS. 3 and 4, the deposition mask 20 includes the aforementioned first surface 20a and the second surface 20b in which the through-holes 25 formed therein, and a pair of long side surfaces 26 and a pair of short side surfaces 27 that are connected to the first surface 20a and the second surface 20b. The pair of long side surfaces 26 extends in the longitudinal direction D1 of the deposition mask 20. When the deposition mask 20 is seen along a normal direction of the first surface 20a, the pair of long side surfaces 26 defines a profile of the deposition mask 20 in the longitudinal direction D1. The pair of short side surfaces 27 extends in the width direction D2 of the deposition mask 20. When the deposition mask 20 is seen along the normal direction of the first surface 20a, the pair of short side surfaces 27 defines a profile of the deposition mask 20 in the width direction D2. In the example shown in FIGS. 3 and 4, the width direction D2 is orthogonal to the longitudinal direction D1. In the description below, a portion at which the first surface 20a and the long side surface 26 are connected is referred to as a first connection portion 20e, and a portion at which the second surface 20b and the long side surface 26 are connected is referred to as a second connection portion 20f. The first connection portion 20e is positioned at a same plane with the first surface 20a. The second connection portion 20f is positioned at a same plane with the second surface 20b.

Next, the structure of the deposition mask 20 related to the through-holes 25 is described. As shown in FIGS. 3 and 4, the deposition mask 20 includes at least one effective area 22 in which through-holes 25 extending from the first surface 20a to reach the second surface 20b are formed, and a surrounding area 23 around the effective area 22. The effective area 22 is an area of the deposition mask 20, which faces a display area of the organic EL substrate 92.

In the example shown in FIGS. 3 and 4, the deposition mask 20 includes a plurality of the effective areas 22 that are arranged at predetermined intervals along the longitudinal direction D1 of the deposition mask 20. One effective area 22 corresponds to a display area of one organic EL display device 100. Thus, the deposition mask apparatus 10 shown in FIG. 1 enables a multifaceted deposition of the organic EL display devices 100. Namely, a pattern of the organic material 98 corresponding to the plurality of organic EL display devices 100 can be formed on one organic substrate 92 with the use of one deposition mask 20.

As shown in FIGS. 3 and 4, the effective area 22 has, for example, a profile of a substantially quadrangular shape in plan view, more precisely, a substantially rectangular shape in plan view. Although not shown, each effective area 22 can have profiles of different shapes depending on a shape of the display area of the organic EL substrate 92. For example, each effective area 22 may have a circular profile.

Figure 5:
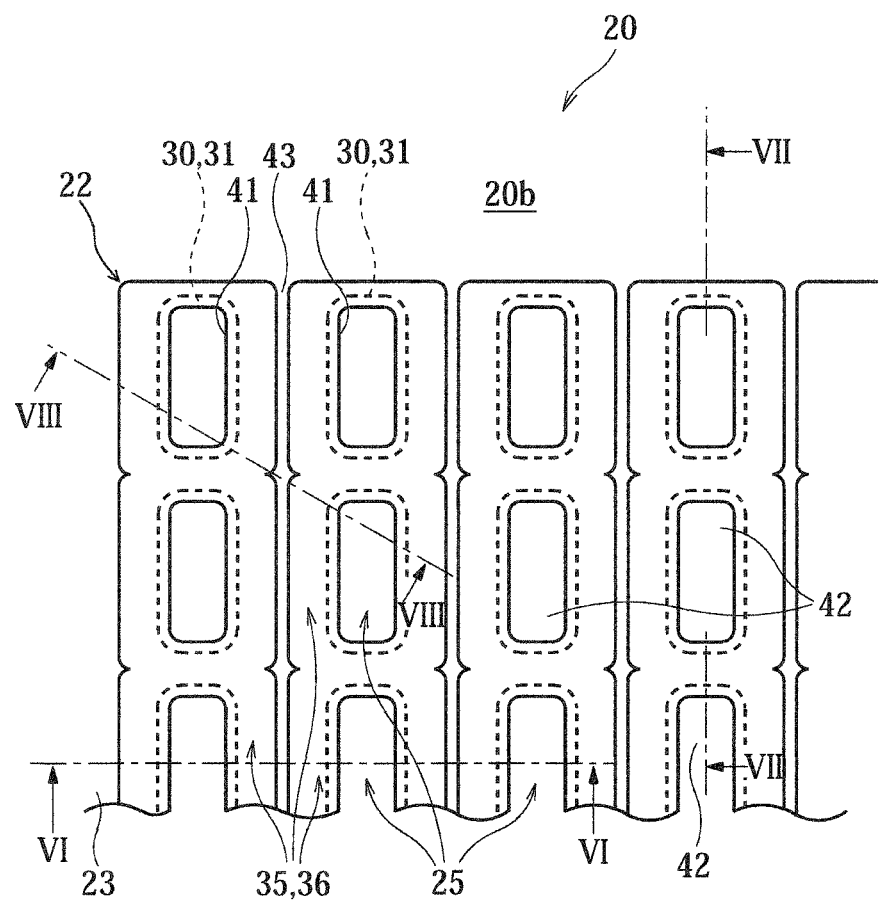
FIG. 5 is a partial plan view showing effective areas of the deposition mask shown in FIG. 3.
Figure 6:
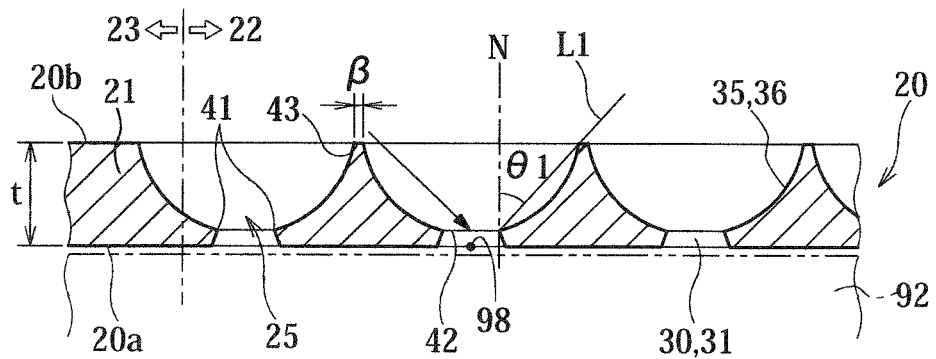
FIG. 6 is a sectional view along the VI-VI line in FIG. 5.
Figure 7:
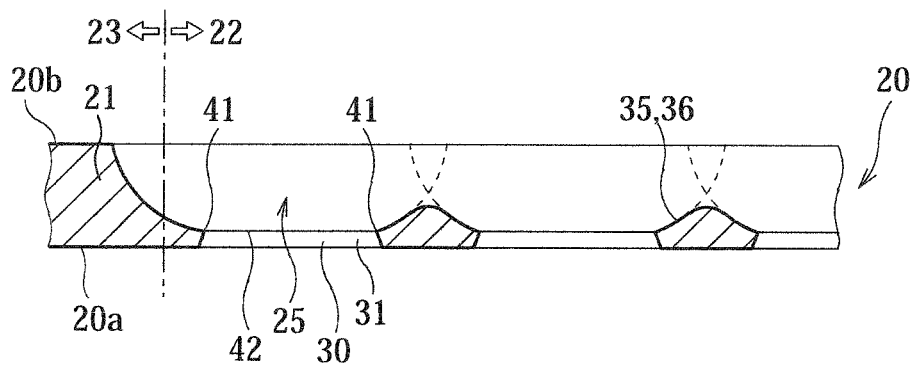
FIG. 7 is a sectional view along the VII-VII line in FIG. 5.
Figure 8:
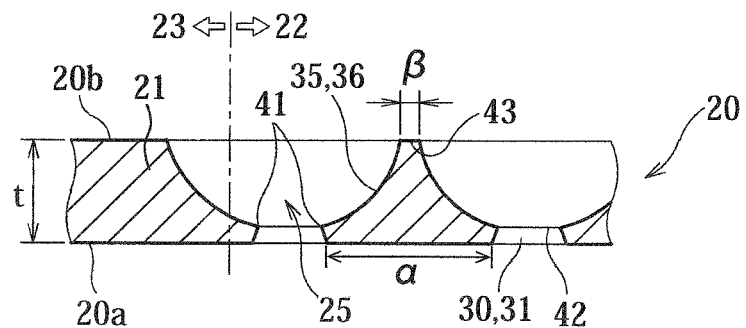
FIG. 8 is a sectional view along the VIII-VIII line in FIG. 5.

Herebelow, a sectional shape of the effective area 22 is described in detail. FIG. 5 is an enlarged plan view showing the effective area 22 when seen from the side of the second surface 20b of the deposition mask 20. As shown in FIG. 5, in the illustrated example, the plurality of through-holes 25 formed in each effective area 22 are arranged in the effective area 22 at predetermined pitches along two directions orthogonal to each other. An example of the through-hole 25 is described in further detail with reference mainly to FIGS. 6 to 8. FIGS. 6 to 8 are sectional views along the VI-VI direction to VIII-VIII direction of the effective area 22 of FIG. 5.

As shown in FIGS. 6 to 8, the plurality of through-holes 25 pass through the deposition mask 20 from the first surface 20a, which is one side along a normal direction N of the deposition mask 20, to the second surface 20b, which is the other side along the normal direction N of the deposition mask 20. In the illustrated example, as described in detail later, first recesses 30 are formed by etching in the first surface 20a of the deposition mask 20, and second recesses 35 are formed in the second surface 20b of the deposition mask 20. Each of the first recesses 30 is connected to each of the second recesses 35, so that the second recess 35 and the first recess 30 are formed to communicate with each other. Each through-hole 25 is composed of the second recess 35 and the first recess 30 connected to the second recess 35.

As shown in FIGS. 6 to 8, an opening area of each second recess 35, in a cross-section along a plate plane of the deposition mask 20 at each position along the normal direction N of the deposition mask, gradually decreases from the side of the second surface 20b of the deposition mask 20 toward the side of the first surface 20a thereof. Similarly, an opening area of each first recess 30, in a cross-section along the plate plane of the deposition mask 20 at each position along the normal direction N of the deposition mask, gradually decreases from the side of the first surface 20a of the deposition mask 20 toward the side of the second surface 20b thereof.

As shown in FIGS. 6 to 8, a wall surface 31 of the first recess 20 and a wall surface 36 of the second recess 35 are connected through a circumferential hole connection portion 41. The hole connection portion 41 is defined by a ridge line of a bulging part where the wall surface 31 of the first recess 30, which is inclined with respect to the normal direction N of the deposition mask 20, and the wall surface 36 of the second recess 35, which is inclined with respect to the normal direction of the deposition mask 20, are merged with each other. The hole connection portion 41 defines a through-portion 42 where an area of the through-hole 25 is minimum in plan view of the deposition mask 20.

As shown in FIGS. 6 to 8, the adjacent two through-holes 25 in the first surface 20a of the deposition mask 20 are spaced apart from each other along the plate plane of the deposition mask 20. Namely, as in the below-described manufacturing method, when the first recesses 30 are composed of etching the base member 21 along the first surface 20a of the deposition mask 20, the first surface 20a remains between the adjacent two first recesses 30.

Similarly, as shown in FIGS. 6 and 8, the adjacent two second recesses 35 may be spaced apart from each other along the plate plane of the deposition mask 20, on the side of the second surface 20b of the deposition mask 20. Namely, the second surface 20b of the deposition mask 20 may remain between the adjacent two second recesses 35. In the below description, this portion of the effective area 22 of the second surface 20b of the deposition mask 20, which is not etched and thus remains, is also referred to as a top portion 43. By manufacturing the deposition mask 20 such that such a top portion 43 remains, the deposition mask 20 can include a sufficient strength. Thus, it can be prevented that the deposition mask 20 is damaged during conveyance, for example. However, when a width β of the top portion 43 is too large, there is a possibility that shadow occurs in the deposition step, which lowers utilization efficiency of the deposition material 98. Thus, the deposition mask 20 is preferably manufactured such that the width β of the top portion 43 is excessively large. For example, the width β of the top portion 43 is preferably equal to or less than 2 μm. In general, the width β of the top portion 43 varies depending on a direction along which the deposition mask 20 is severed. For example, the width β of the top portion 43 shown in FIG. 6 and that of FIG. 8 may differ from each other. In this case, the deposition mask 30 may be formed such that the width 13 of the top portion 43 is equal to or less than 2 μm, regardless of a direction along which the deposition mask 20 is severed. The shadow means a phenomenon in which a surface area and/or a thickness of a layer of the deposition material 98 on the substrate lack, because a part of the deposition material 98, which came from the deposition source to reach the deposition mask 20, hits the wall surface 31 of the first recess 30 of the deposition mask 20 and/or the wall surface 36 of the second recess 35 thereof so as not to reach the substrate such as the organic EL substrate 92.

As shown in FIG. 7, the etching process may be performed such that adjacent two second recesses 35 are connected to each other, depending on their positions. Namely, there may be a part where no second surface 20b remains between the adjacent two second recesses 35. In addition, although not shown, the etching process may be performed such that adjacent two second recesses 35 are connected over the whole area of the second surface 20b.

When the deposition mask apparatus 10 is received in the deposition apparatus 90 as shown in FIG. 1, the first surface 20a of the deposition mask 20 faces the organic EL substrate 92, and the second surface 20b of the deposition mask 20 is located along the crucible 94 holding the deposition material 98. Thus, the deposition material 98 adheres to the organic EL substrate 92 through the second recess 35 whose opening area gradually decreases. As indicated by the arrow in FIG. 6 extending from the second surface 20b toward the first surface 20a, the deposition material 98 not only moves from the crucible 94 toward the organic EL substrate 92 along the normal direction N of the organic EL substrate 92, but also sometimes moves along a direction largely inclined with respect to the normal direction N of the organic EL substrate 92. At this time, when the thickness of the deposition mask 20 is large, most of the diagonally moving deposition material 98 reaches the wall surface 36 of the second recess 35 to adhere thereto, before the deposition material 98 passes through the through-holes 25 to reach the organic EL substrate 92. Thus, in order to improve utilization efficiency of the deposition material 98, it is preferable that the thickness t of the deposition mask 20 is reduced so that heights of the wall surface 36 of the second recess 35 and the wall surface 31 of the first recess 30 are reduced. Namely, it can be said that it is preferable that a base member 21, which has the thickness t as small as possible, as long as the strength of the deposition mask 20 is ensured, is used as the base member 21 for constituting the deposition mask 20. In consideration of this point, the thickness t of the deposition mask 20 in this embodiment is preferably set to be equal to or less than 50 μm, e.g., equal to or more than 5 μm and equal to or less than 50 μm. The thickness t of the deposition mask 20 may be equal to or less than 30 μm, may be equal to or less than 25 μm, may be equal to or less than 20 μm, may be equal to or less than 18 μm, may be equal to or less than 15 μm, or may be equal to or less than 13 μm. By reducing the thickness t of the deposition mask 20, it can be prevented that the deposition material 98 hits the wall surface 31 of the first recess 30 and/or the wall surface 36 of the second recess 35 in the deposition step, whereby generation of shadow can be prevented. In addition, the thickness of the metal plate 64 may be equal to or more than 2 μm, may be equal to or more than 5 μm, may be equal to or more than 10 μm, or may be equal to or more than 15 μm. The thickness t is a thickness of the surrounding area 23, i.e., a thickness of a part of the deposition mask 20 where the first recess 30 and the second recess 35 are not formed. Therefore, the thickness t can be said as a thickness of the base member 21. In addition, the thickness t can be said as a thickness of the metal plate 64 constituting the base member 21 of the deposition mask 20.

In FIG. 6, a minimum angle defined by a line L1, which passes the connection portion 31 including the minimum opening area of the through-hole 25 and another given position of the wall surface 36 of the second recess 35, with respect to the normal direction N of the deposition mask 20 is represented by a symbol θ1. In order that the diagonally moving deposition material 98 can be caused to reach the organic EL substrate 92 with being caused to reach the wall surface 36 as much as possible, it is advantageous that the angle θ1 is increased. In order to increase the angle θ1, it is effective to reduce the aforementioned width β of the top portion 43, as well as to reduce the thickness t of the deposition mask 20.

In FIG. 8, the symbol a represents a width of a portion (hereinafter also referred to as "rib portion") of the effective area 22 of the first surface 20a of the deposition mask 20, which is not etched and thus remains. A width α of the rib portion and a size $r_2$ of the through-portion 42 are suitably determined depending on a size of an organic EL display device and the number of display pixels. For example, the width a of the rib portion is equal to or more than 5 μm and equal to or less than 40 μm, and the size $r_2$ of the through-portion 42 is equal to or more than 10 μm and equal to or less than 60 μtm.

Figure 9:
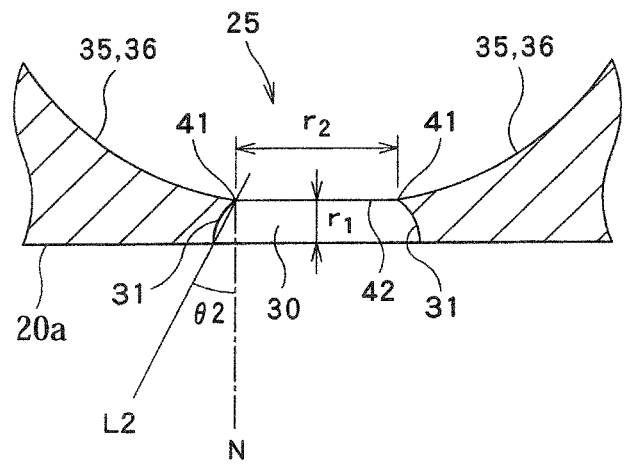
FIG. 9 is an enlarged sectional view showing a through-hole shown in FIG. 5 and an area near thereto.

Although not limited, the deposition mask 20 according to this embodiment is particularly effective when an organic EL display device including a pixel density of equal to or more than 450 ppi is manufactured. Herebelow, a size example of the deposition mask 20 required for manufacturing an organic EL display device having such a high pixel density is described with reference to FIG. 9. FIG. 9 is an enlarged sectional view showing the through-hole 25 of the deposition mask 20 shown in FIG. 6 and an area near thereto.

In FIG. 9, as parameters related to the shape of the through-hole 25, a distance from the first surface 20a of the deposition mask 20 up to the hole connection portion 41 thereof along the normal direction N of the deposition mask 20, i.e., a height of the wall surface 31 of the first recess 30 is represented by a symbol $r_1$. Further, a size of the first recess 30 in a part where the first recess 30 is connected to the second recess 35, i.e., a size of the through-portion 42 is represented by a symbol $r_2$. In addition, in FIG. 9, an angle that is defined by a line L2, which connects the hole connection portion 41 and a distal edge of the first recess 30 in the first surface 21a of the base member 21, with respect to the normal direction N of the base member 21 is represented by a symbol θ2.

When an organic EL display device having a pixel density of equal to or more than 450 ppi is manufactured, the size $r_2$ of the through-portion 42 is preferably set to be equal to or more than 10 and equal to or less than 60 μm. Due to this size, it is possible to provide the deposition mask 20 capable of manufacturing an organic EL display device having a high pixel density. Preferably, the height $r_1$ of the wall surface 31 of the first recess 30 is set to be equal to or less than 6 μm.

Next, the aforementioned angle θ2 shown in FIG. 9 is described. The angle θ2 corresponds to a maximum value of an inclined angle of the deposition material 98 that can reach the organic EL substrate 92, out of the deposition material 98 that comes in an inclined manner with respect to the normal direction N of the base member 21 and passes through the through-portion 42 near the through-connection portion 41. This is because the deposition material 98 coming at an inclined angle greater than the angle θ2 adheres to the wall surface 31 of the first recess 30, before the deposition material 98 reaches the substrate 92. Thus, by decreasing the angle θ2, it can be prevented that the deposition material 98 coming at a large inclined angle and passing through the through-portion 42 adheres to the substrate 92. Therefore, it can be prevented that the deposition material 98 adheres to a portion of the organic EL substrate 92, which is outside a part overlapping with the through-portion 42. Namely, to decrease the angle θ2 can prevent variation in surface area and thickness of the deposition material 98 adhering to the organic EL substrate 92. From this point of view, the through-hole 25 is formed such that the angle θ2 is equal to or less than 45 degrees, for example. FIG. 9 shows the example in which the size of the first recess 30 in the first surface 21a, i.e., the opening size of the through-hole 25 in the first surface 21a is larger than the size $r_2$ of the first recess 30 in the through-connection portion 41. Namely, the value of the angle θ2 is a positive value. However, although not shown, the size $r_2$ of the first recess 30 in the through-connection portion 41 may be larger than the size of the first recess 30 in the first surface 21a. Namely, the value of the angle θ2 may be a negative value.

Figure 10:
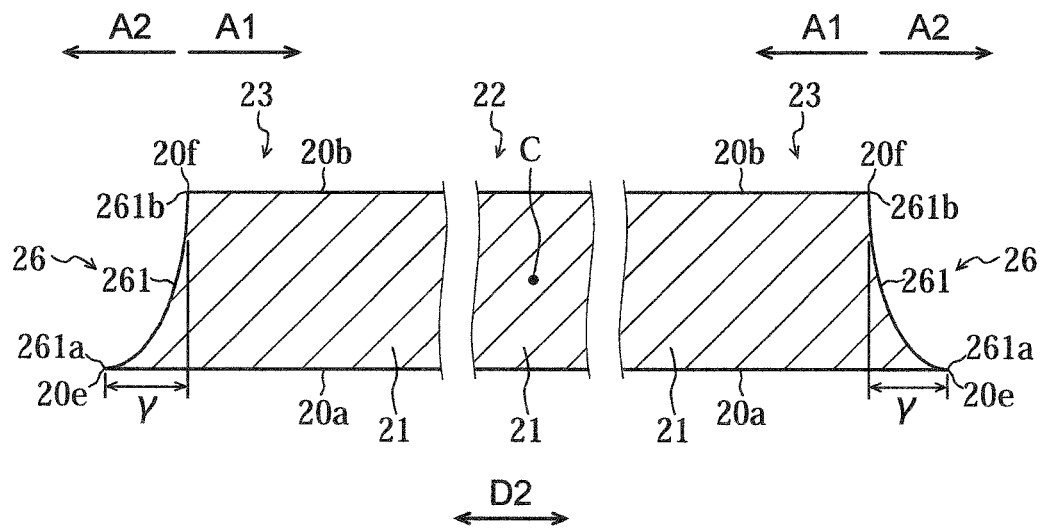
FIG. 10 is a sectional view along the X-X line in FIG. 4.

Next, a sectional shape of the surrounding area 23 is described in detail. FIG. 10 is a sectional view of the deposition mask 20 when cut along the X-X line in FIG. 4. As shown in FIG. 10, the long side surface 26 constituting an end portion of the surrounding area 23 includes a first portion 261 which is a surface that is recessed inside. In this embodiment, the first portion 261 is a curved surface that is curved to be recessed inside. When the long side surface 26 is seen from outside along a plane direction of the first surface 20a, the first portion 261 includes a first end portion 261a that defines a profile of the first portion 261 along the first surface 20a, and a second end portion 261b that defines a profile of the first portion 261 along the second surface 20b. When the term "inside" is used for the long side surface 26, as indicated by the arrow Al in FIG. 10 and below-described FIG. 22B, the "inside" means a center side in the width direction D2 of the deposition mask 20. As shown in FIGS. 4 and 10, the "center side" means a side of a centerline C that passes an intermediate point of the deposition mask 20 in the width direction D2. In addition, as shown by the arrow A2 in FIG. 10 and the below-described FIG. 22B, the "outside" means a side away from the centerline C of the deposition mask 20 in the width direction D2 of the deposition mask 20. In addition, the term "recessed inside" means that the first portion 261 is positioned inside a virtual line or plane connecting the first end portion 261a of the first portion 261 along the first surface 20a and the second end portion 261b of the first portion 261a along the second surface 20b. Although not shown, the first portion 261 may include a flat surface. Namely, it is not necessary that the first portion 261 is formed only of a curved surface. In addition, the first portion 261 may locally include an irregular surface having a zigzag shape.

As shown in FIG. 10, the first end portion 261a of the first portion 261 is positioned outside the second end portion 261b. As described below, such a first portion 261 is formed by etching a metal plate constituting the base member 21 along the second surface 20b. A distance γ between the first end portion 261a and the second end portion 261b in the width direction D2 is, for example, equal to or more than 5 μm and equal to or less than 50 μm.

In the example shown in FIG. 10, the second end portion 261b of the first portion 261 corresponds to the second connection portion 20f at which the second surface 20b and the long side surface 26 are connected. In other words, the first portion 261 spreads up to the second surface 20b. In addition, in the example shown in FIG. 10, the first end portion 261a of the first portion 261 corresponds to the first connection portion 20e at which the first surface 20a and the long side surface 26 are connected. In other words, the first portion 261 spreads up to the first surface 20a.

Figure 11:
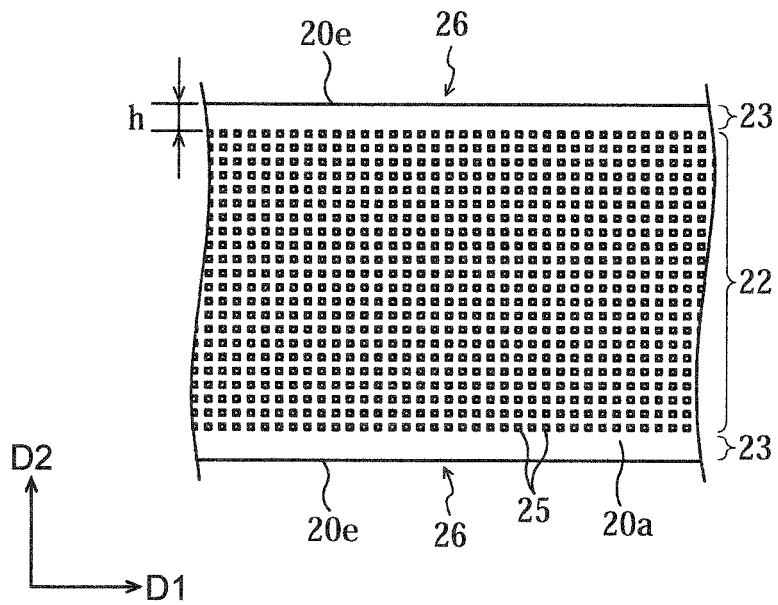
FIG. 11 is a plan view showing the deposition mask seen from the side of a first surface.

Next, a shape of the long side surface 26 in plan view is described. FIG. 11 is a plan view of the long side surface 26 when seen from the side of the first surface 20a along the normal direction of the first surface 20a. In addition, FIG. 12 is a plan view of the long side surface 26 when seen from the side of the second surface 20b along the normal direction of the second surface 20b.

As shown in FIG. 11, when the long side surface 26 is seen from the side of the first surface 20a, the first portion 261 is invisible. In this case, the profile of the deposition mask 20 in the longitudinal direction D1 is defined by the first connection portion 20e at which the first surface 20a and the long side surface 26 are connected. In this case, an area near to the first connection portion 20e is formed of the flat first surface 20a. Thus, the position of the profile of the deposition mask 20 in the longitudinal direction D1 can be easily detected.

Figure 12:
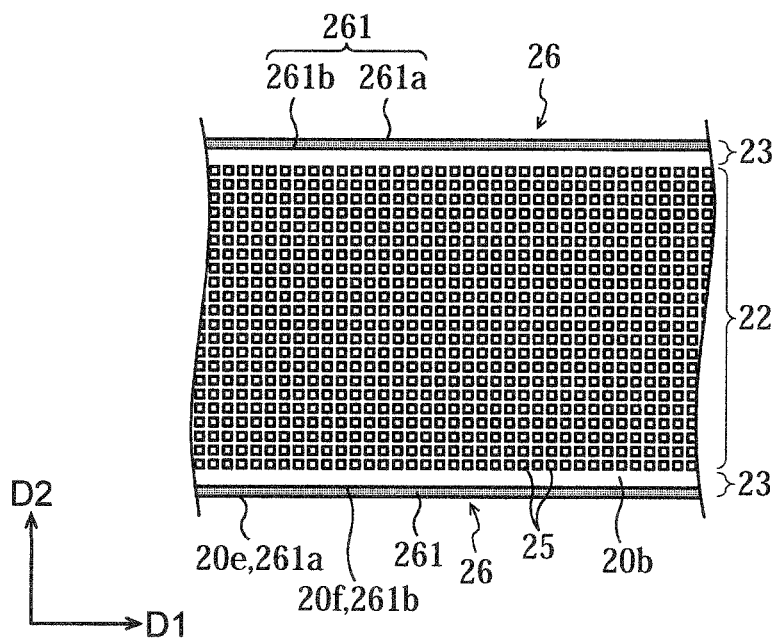
FIG. 12 is a plan view showing the deposition mask seen from the side of a second surface.

On the other hand, as apparent from FIG. 12, when the long side surface 26 is seen from the side of the second surface 20b, the first portion 261 is visible. In the first portion 261, light is scattered in various directions. Thus, in the example shown in FIG. 12, the first portion 261 is observed as a portion that seems darker than the second surface 20b, or is displayed as such a portion in an image. In addition, the first portion 261 has a width corresponding to the distance $y$ in FIG. 10. Thus, at a position of the profile of the deposition mask 20 when seen from the side of the second surface 20b, there is an unclear portion corresponding to the width of the first portion 261. Thus, as compared with a case in which the first portion 261 is seen from the side of the first surface 20a, it is more difficult to detect a position of the profile of the deposition mask 20 in the longitudinal direction D1, when seen from the side of the second surface 20b. Thus, in a step of positioning the deposition mask 20 with respect to the organic EL substrate 92 or the frame 15, it is easy to adjust the position of the deposition mask 20 based on a result of an image of the deposition mask 20 photographed from the side of the first surface 20a, whereby a positional precision can be improved.

Next, a manufacturing method of a deposition mask 20 is described.

Firstly, a metal plate 64 for manufacturing a deposition mask is prepared. The metal plate 64 is prepared in the form of a roll obtained by winding an elongated metal plate. As the metal plate 64, a metal plate made of an iron alloy containing nickel is used, for example. A thickness of the metal plate 64 is equal to or more than 5 μm and equal to or less than 50 A rolling method or a plating deposition method can be employed as a method of manufacturing the metal plate 64 having a desired thickness.

Next, a method of manufacturing the deposition mask 20 with the use of the metal plate 64 is described with reference mainly to FIGS. 13 to 24. In the below-described manufacturing method of the deposition mask 20, as shown in FIG. 13, the metal plate 64 is processed such that a plurality of deposition mask portions including the through-holes 25 are formed on the metal plate 64 (processing step), and then the deposition mask portions are separated from the metal plate 64 (separation step), so that the sheet-like deposition masks 20 can be obtained.

The step of processing the metal plate 64 includes a step of etching the elongated metal plate 64 by using a photolithographic technique to form first recesses 30 along a first surface 64a of the metal plate 64, and a step of etching the metal plate 64 by using a photographic technique to form second recesses 35 along a second surface 64b of the metal plate 64. By communicating the first recesses 30 and the second recesses 35 formed in the metal plate 64 to each other, the through-holes 25 are manufactured in the metal plate 64. In the below-described example, the step of forming the first recesses 30 is performed before the step of forming the second recesses 35, and a step of sealing the manufactured first recesses 30 is performed between the step of forming the first recesses 30 and the step of forming the second recesses 35. Herebelow, the respective steps are described in detail.

Figure 13:
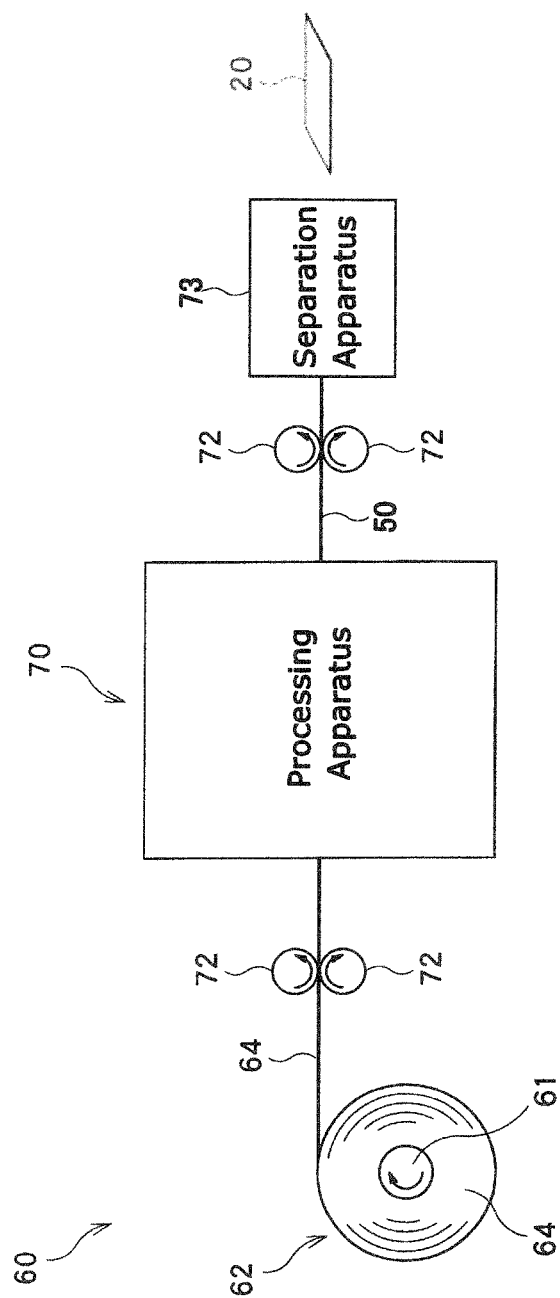
FIG. 13 is a schematic view for generally describing an example of a manufacturing method of a deposition mask.

FIG. 13 shows a manufacturing apparatus 60 for manufacturing the deposition masks 20. As shown in FIG. 13, a roll 62 including a core 61 around which the metal plate 64 is wound is prepared. By rotating the core 61 to reel out the roll 62, the metal plate 64 extending like a strip is supplied, as shown in FIG. 13.

The supplied metal plate 64 is conveyed to a processing apparatus (etching means) 70 by a conveyor roller 72. Respective processes shown in FIGS. 14 to 21 are performed by the processing apparatus 70. In this embodiment, the plurality of depositions masks 20 is allocated in a width direction of the metal plate 64. In other words, the metal plate 64 is processed such that the below-described deposition mask portions, which will be separated from the metal plate 64 to provide the deposition masks 20, are aligned in the width direction of the metal plate 64. In this case, preferably, the plurality of deposition masks 20 are allocated to the metal plate 64 such that the direction of a long side surface 26 of the deposition mask portion, i.e., the deposition mask 20 corresponds to the longitudinal direction of the eloigned metal plate 64.

Figure 14:
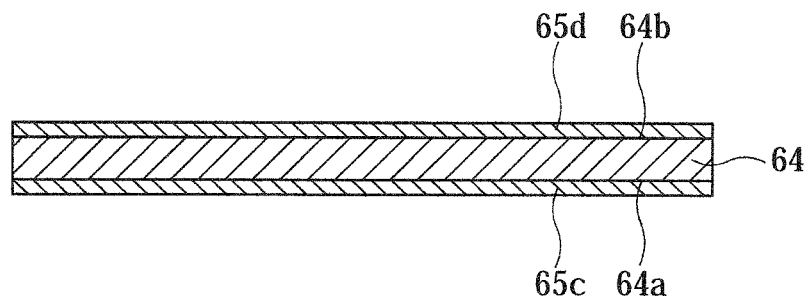
FIG. 14 is a view showing a step of forming a resist film on a metal plate.

As shown in FIG. 14, resist films 65c, 65d each containing a negative-type photosensitive resist material are firstly formed on the first surface 64a and the second surface 64b of the metal plate 64. For example, the resist films 65c, 65d are formed by applying a coating liquid containing a negative-type photosensitive resist material onto the first surface 64a and the second surface 64b of the metal plate 64, and then by drying the coating liquid.

Figure 15:
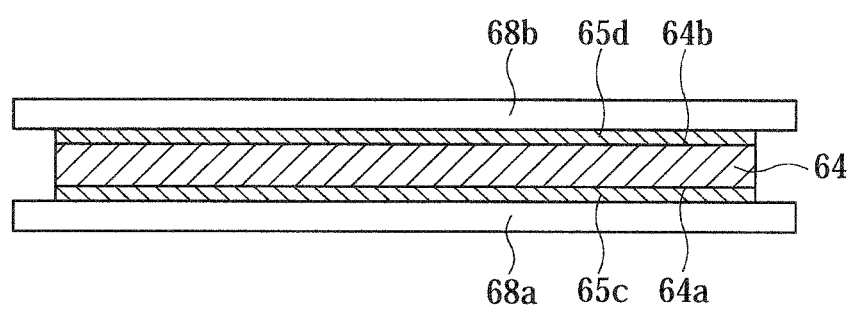
FIG. 15 is a view showing a step of bringing an exposure mask into tight contact with the resist film.

Then, exposure masks 68a, 68b, which do not allow light transmit through areas of the resist films 65c, 65d to be removed therefrom, are prepared. As shown in FIG. 15, the exposure masks 68a, 68b are located on the resist films 65c, 65d, respectively. For example, glass dry plates, which do not allow light to transmit through the areas to be removed from the resist films 65c, 65d, are used as the exposure masks 68a, 68b. Thereafter, the exposure masks 68a, 68b are sufficiently brought into tight contact with the resist films 65c, 65d by vacuum bonding.

A positive-type photosensitive resist material may be used. In this case, an exposure mask, which allows light to transmit through an area to be removed of the resist film, is used.

Figure 16:
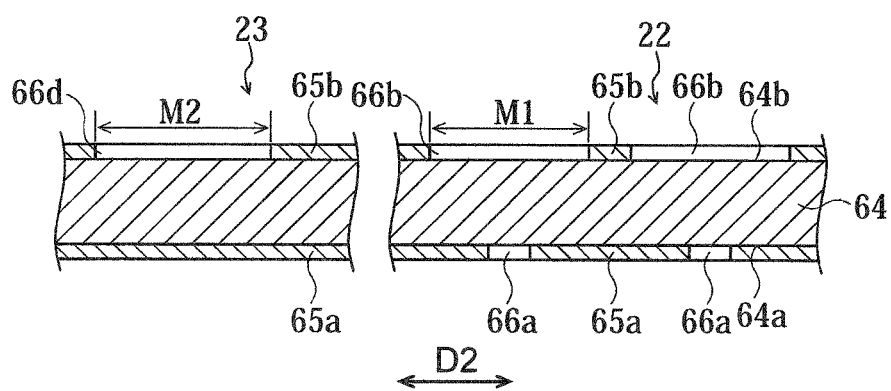
FIG. 16 is a view showing a step of developing the resist film.

Thereafter, the resist films 65c, 65d are exposed across the exposure masks 68a, 68b (exposure step). Further, in order to form an image on the exposed resist films 65c, 65d, the resist films 65c, 65d are developed (development step). Thus, as shown in FIG. 16, a first resist pattern 65a can be formed on the first surface 64a of the metal plate 64, and a second resist pattern 65b can be formed on the second surface 64b of the metal plate 64. The development step may include a resist heating step for increasing a hardness of the resist films 65c, 65d, or for more securely adhering the resist films 65c, 65d to the metal plate 64. The resist heating step can be performed at a temperature equal to or more than a room temperature and equal to or less than 400° C., for example. In FIG. 16 and the below-described FIGS. 17 to 21, a manufacturing step of the effective area 22 is shown on the right side, and a manufacturing step of the surrounding area 23 is shown on the left side.

As shown in FIG. 16, the first resist pattern 65a provided on the effective area 22 has a hole 66a located at a position where the first recess 30 is formed in the first surface 64a thereafter. On the other hand, the first resist pattern 65a provided on the surrounding area 23 covers a portion which becomes the long side surface 26 of the first surface 64a thereafter. In addition, the second resist pattern 65b includes a hole 66b located at a position where the second recess 35 is formed in the second surface 64b of the effective area 22 thereafter, and an opening 66d located at a portion which becomes the long side surface 26 of the second surface 64b of the surrounding area 23 thereafter. A size M2 of the opening 66d is larger than a size M1 of the hole 66b. The size M2 of the opening 66d is equal to or more than 50 μm, for example.

Figure 17:
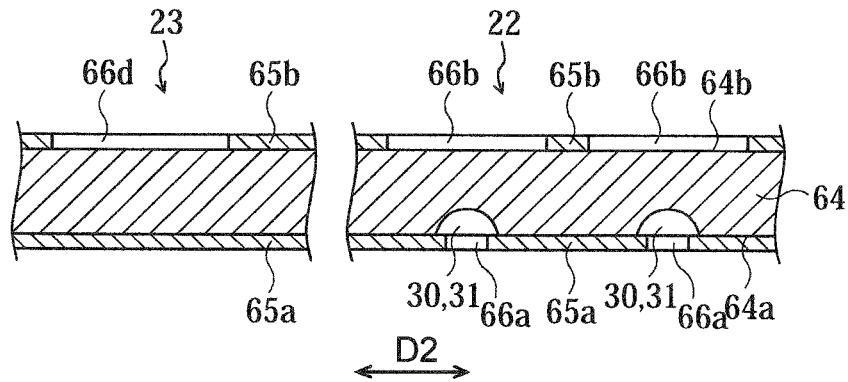
FIG. 17 is a view showing a first-surface etching step.

Then, as shown in FIG. 17, a first-surface etching step is performed, in which areas of the first surface 64a of the metal plate 64, which are not covered with the first resist pattern 65a, are etched by using a first etchant. For example, the first etchant is jetted to the first surface 64a of the metal plate 64 across the first resist pattern 65a, from a nozzle disposed on the side facing the first surface 64a of the conveyed metal plate 64. As a result, as shown in FIG. 17, the areas of the metal plate 64, which correspond to the holes 66a in the first surface 64a of the metal plate 64, are eroded by the first etchant. Thus, the plurality of first recesses 30 are formed in the first surface 64a of the metal plate 64. The first etchant to be used is an etchant containing ferric chloride solution and hydrochloric acid, for example. As described above, the first resist pattern 65a provided on the surrounding area 23 covers the portion which becomes the long side surface 26 of the first surface 64a thereafter. Thus, the first recess 30 is not formed in the portion of the first surface 64a, which becomes the long side surface 26 thereafter.

Figure 18:
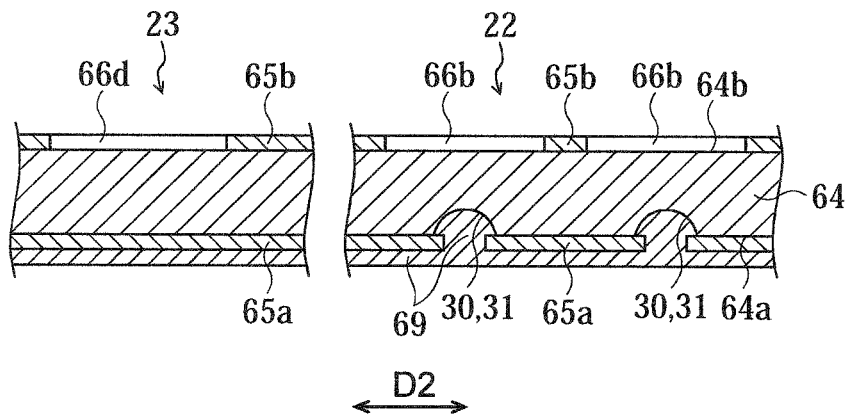
FIG. 18 is a view showing a step of coating a first recess with a resin.

Thereafter, as shown in FIG. 18, the first recesses 30 are coated with a resin 69 resistant to a second etchant that is used in a succeeding second-surface etching step. Namely, the first recesses 30 are sealed with the resin 69 resistant to the second etchant. In the example shown in FIG. 18, a film of the resin 69 is formed to cover not only the formed first recesses 30 but also the first surface 64a (first resist pattern 65a).

Figure 19:
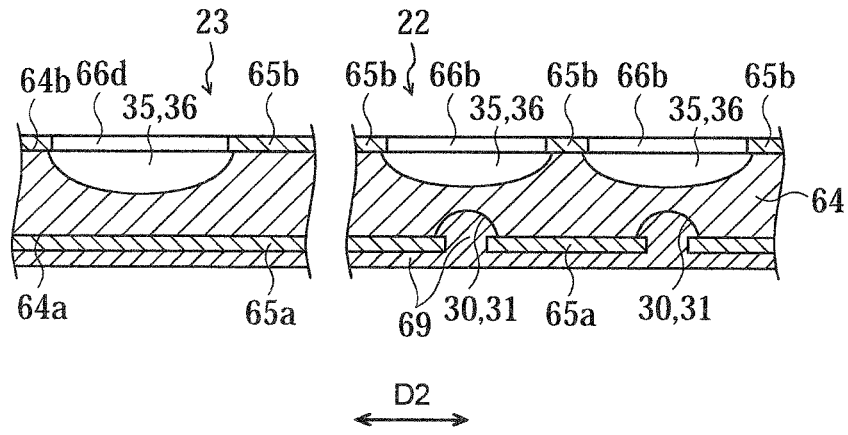
FIG. 19 is a view showing a second-surface etching step.
Figure 20:
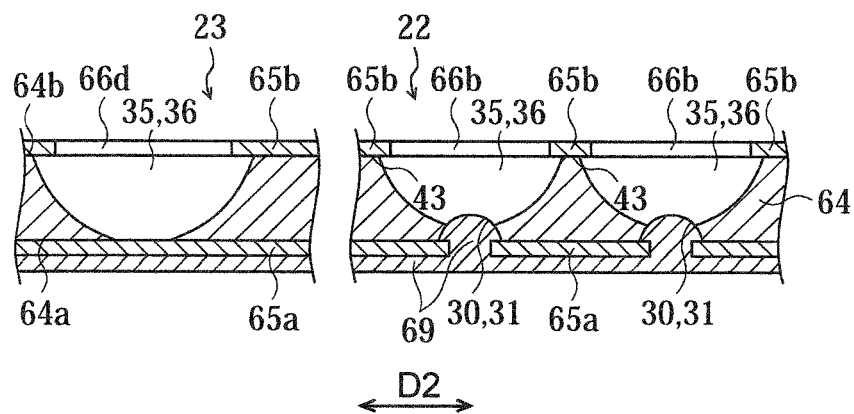
FIG. 20 is a view showing the second-surface etching step succeeding to FIG. 19.

Then, as shown in FIG. 19, the second-surface etching step is performed, in which areas of the second surface 64b of the metal plate 64, which correspond to the holes 66b and the openings 66d, are etched so as to form the second recesses 35 in the second surface 64b. FIG. 20 is a view showing a state in which the second-surface etching step further proceeds. As shown in FIG. 20, in the area of the metal plate 64, which corresponds to the effective area 22, the second-surface etching step is performed until the first recess 30 and the second recess 35 communicate with each other so that the through-hole 25 is formed. On the other hand, in the area of the metal plate 64, which corresponds to the surrounding area 23, the second-surface etching step is performed until the second recess 35 reaches the first surface 64a. As described above, the size M2 of the opening 66d of the second resist pattern 65b positioned on the surrounding area 23 is larger than the size M1 of the hole 66b of the second resist pattern 65b positioned on the effective area 22. Thus, as shown in FIG. 20, the etching in the thickness direction of the metal plate 64 can be made to progress more quickly in the surrounding area 23 than the effective area 22. Similarly to the first etchant, the second etchant to be used is an etchant containing ferric chloride solution and hydrochloric acid, for example.

The erosion by the second etchant develops in a part where the metal plate 64 is in contact with the second etchant. Thus, the erosion develops not only in the normal direction N (thickness direction) of the metal plate 64 but also in a direction along the plate plane of the metal plate 64. Preferably, the second-surface etching step is ended before two second recesses 35, which are respectively formed on positions facing adjacent two holes 66a of the second resist pattern 65b, merge on the reverse side of the second resist pattern 65b positioned between the two holes 66a. Thus, as shown in FIG. 20, the aforementioned top portion 43 can remain in the second surface 64b of the metal plate 64.

Figure 21:
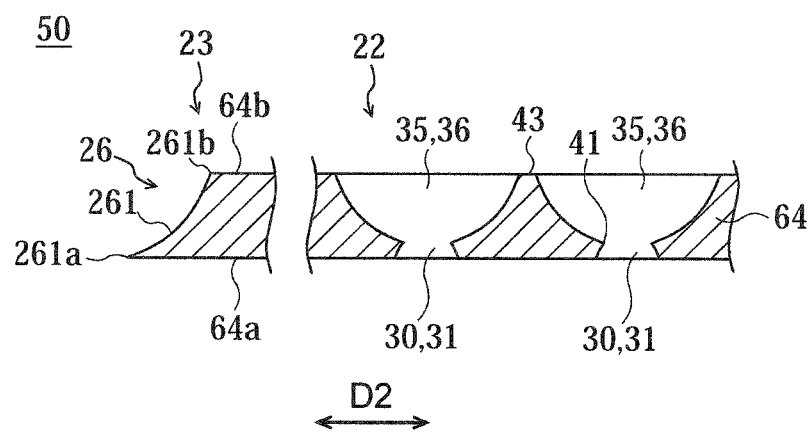
FIG. 21 is a view showing a step of removing the resin and a resist pattern from the metal plate.

Thereafter, as shown in FIG. 21, the resin 69 is removed from the metal plate 64. For example, the resin 69 can be removed by using an alkali-based peeling liquid. When the alkali-based peeling liquid is used, as shown in FIG. 21, the resist patterns 65a, 65b are removed simultaneously with the removal of the resin 69. However, after the removal of the resin 69, the resist patterns 65a, 65b may be removed separately from the resin 69.

As shown in FIG. 21, in the area of the metal plate 64, which corresponds to the surrounding area 23, since the second recess 35 reaches the first surface 64a, the long side surface 26 separated from another part of the metal plate 64 in the width direction D2 can be formed. The long side surface 26 includes the first portion 261 based on the second recess 35 which was formed in the second surface 64b of the metal plate 64 correspondingly to the opening 66d of the second resist pattern 65b. In this case, the first end portion 261a of the first portion 261 corresponds to the first connection portion 20e at which the long side surface 26 and the first surface 64a (first surface 20a) are connected.

Figure 22A:
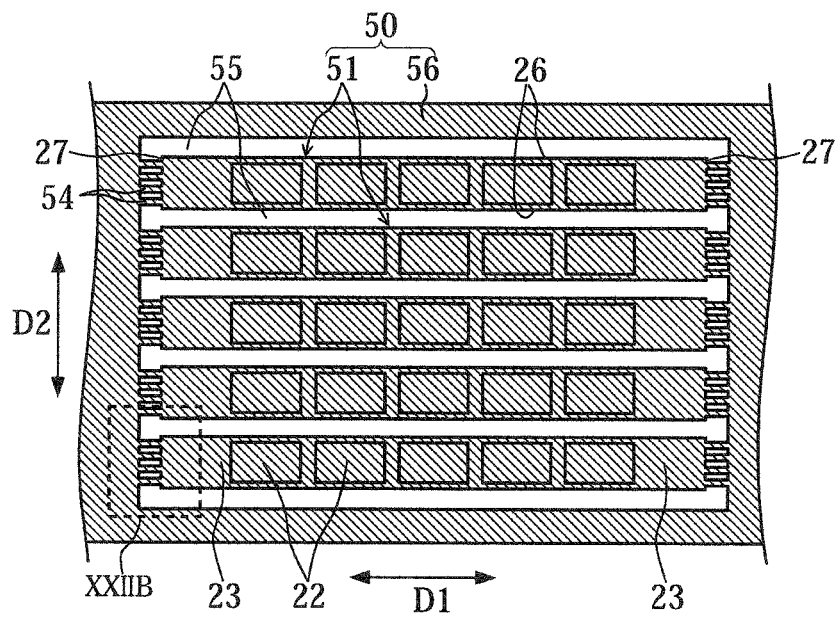
FIG. 22A is a plan view showing an intermediate product obtained by processing the metal plate.

FIG. 22A is a plan view showing an intermediate product 50 obtained by processing the deposition masks 20 to form the through-holes 25, as described above. The intermediate product 50 includes the plurality of deposition mask portions 51 and a support portion 56. A conveying direction of the metal plate 64 in the manufacturing step of the deposition masks 20 corresponds to the longitudinal direction D1.

Each deposition mask portion 51 is a portion of the metal plate 64, which becomes the deposition mask 20 by separation. As shown in FIG. 22A, the deposition mask portions 51 are arranged side by side in the width direction D2.

The support portion 56 is a portion that surrounds the plurality of deposition mask portions 51 in a plan view, and is partially connected to the deposition mask portions 51. In the example shown in FIG. 22A, the support portion 56 is a portion of the metal plate 64, which is other than the deposition mask portions 51. As shown in FIG. 22A, the deposition mask portions 51 are connected to the support portion 56 at the short side surfaces 27 through a connection portion 54.

Figure 22B:
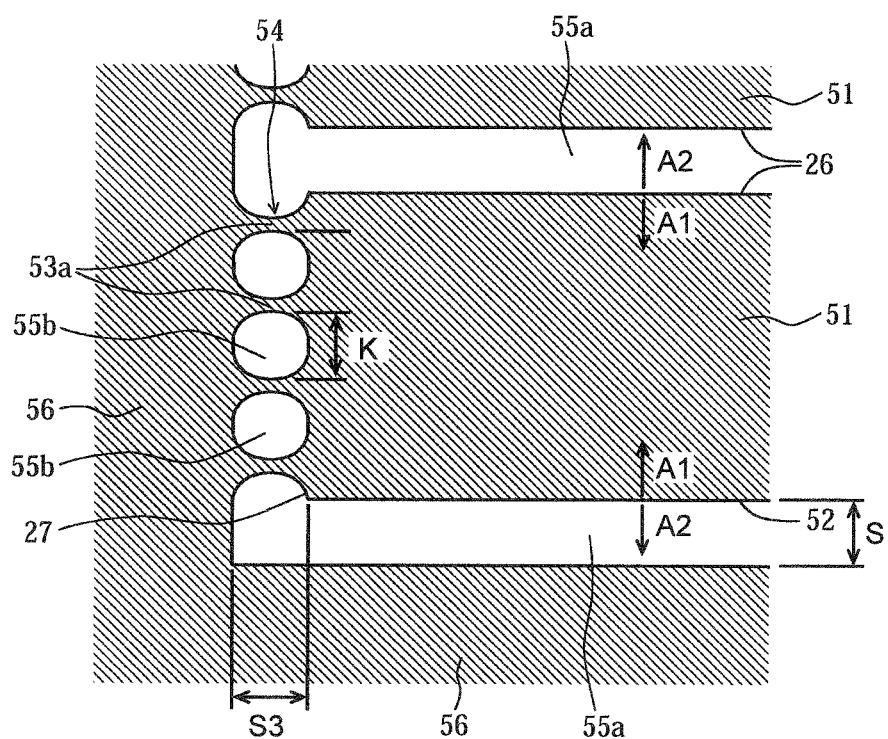
FIG. 22B is an enlarged view showing an area of the intermediate product of FIG. 22A, which is surrounded by dotted lines indicated by the symbol XXIIB.

FIG. 22B is an enlarged view showing an area of the intermediate product of FIG. 22A, which is surrounded by dotted lines indicated by the symbol XXIIB. In the aforementioned connection portion 54, the short side surface 27 of the deposition mask portion 51 includes a plurality of projections 53a protruding toward the support portion 56 so as to be connected to the support portion 56. For example, between the short side surface 27 of the intermediate product 50 and the support portion 56 thereof, a plurality of second through-portions 55b passing through the metal plate 64 are arranged side by side along a direction in which the short side surface 27 extends. A size K of the second through-portion 55b in the width direction D2 is equal to or more than 30 μm, for example, or equal to or less than 100 μm, for example. The projection 53a is positioned between two second through-portions 55b that are adjacent in the direction in which the short side surface 27 extends. On the other hand, the long side surface 26 of the deposition mask portion 51 is not connected to the support portion 56. In other words, in the intermediate product 50, between the long side surface 26 of the deposition mask portion 51 and the support portion 56, a first through-portion 55a passing through the metal plate 64 extends along a direction in which the long side surface 26 extends. A size S of the first through-portion 55a in the width direction D2 is equal to or more than 0.1 mm, for example, or equal to or less than 5 mm, for example.

As described above, the first through-portion 55a constituting the long side surface 26 is formed by performing the second-surface etching step until the second recess 35 reaches the first surface 64a. In this case, the first end portion 261a of the aforementioned portion 261 included in the long side surface 26, which is formed by the second-surface etching step, is positioned on the first surface 64a of the metal plate 64. Namely, the first end portion 261a of the first portion 261 corresponds to the first connection portion 20e at which the first surface 20a of the deposition mask 20 and the long side surface 26 thereof are connected.

Similarly to the first through-portion 55a constituting the long side surface 26, the second through-portions 55b constituting the short side surface 27 are formed by performing the second-surface etching step until the second recess 35 reaches the first surface 64a.

The fact that the first through-portion 55a and the second through-portion 55b are formed by performing the second-surface etching step until the second recess 35 reach the first surface 64a means that the first through-portion 55a and the second through-portion 55b do not include the first recess 30 connected to the second recess 35. An advantage obtained by the fact that the first through-portion 55a and the second through-portion 55b do not include the first recess 30 is described below.

After the first-surface etching step, the metal plate 64 is conveyed to a location where the second-surface etching step is performed. At this time, when the first recess 30 is formed in the first-surface etching step in a portion of the metal plate 64, at which the long side surface 26 or the short side surface 27 is formed thereafter, the metal plate 64 may crack from the first recess 30 during the conveyance. Since the first recess 30 formed in the portion where the long side surface 26 is formed has a size equivalent to that of the deposition mask 20 in the longitudinal direction D1, cracking is particularly likely to generate from this first recess 30.

On the other hand, in this embodiment, the first through-portion 55a or the second through-portion 55b does not include the first recess 30. Thus, in the first-surface etching step, no first recess 30 is formed in a portion of the metal plate 64, at which the long side surface 26 or the second side surface 27 is formed thereafter. Therefore, when the metal plate 64 is conveyed to a location where the second-surface etching step is performed after the first-surface etching step, it can be prevented that the metal plate 64 is defectively conveyed, e.g., the metal plate 64 cracks.

In addition, the fact that the first recess 30 is not formed means that a step of coating the first recess 30 with the resin 69 is unnecessary. If the first recess 30 is formed in a portion at which the long side surface 26 is formed, since a size of the portion is larger than the size of the first recess 30 constituting the through-hole 25, cost and effort required for coating the first recess with the resin 69 are great. On the other hand, according to this embodiment, since the first through-portion 55a or the second through-portion 55b does not include the first recess 30, cost and effort required for coating the first recess 30 with the resin 69 can be saved.

Following thereto, the separation step is performed, in which the deposition mask portions 51 of the aforementioned intermediate product 50 are separated from the support portion 56 thereof. As shown in FIG. 13, the intermediate product 50 obtained by processing the metal plate 64 is firstly conveyed to a separation apparatus 73 for performing the separation step. For example, the intermediate product 50 is conveyed to the separation apparatus 73 by the conveyor rollers 72, 72 that are rotated with sandwiching the intermediate product 50 therebetween. In the intermediate product 50, when the long side surface 26 of the deposition mask portion 51 is not connected to the support portion 56, the deposition mask portion 51 tends to shake and/or warp during conveyance. In consideration of this point, the intermediate product 50, the conveyor rollers 72 or a conveyor path may be equipped with means for restraining shaking and/or warping of the deposition mask portion 51. For example, the restraint means include a pair of films disposed on the first surface side and the second surface side of the intermediate product 50. Since the intermediate product 50 is conveyed to the separation apparatus 73 with the intermediate product 50 being sandwiched between the pair of films, shaking and/or warping of the deposition mask portion 51 can be prevented.

Figure 23:
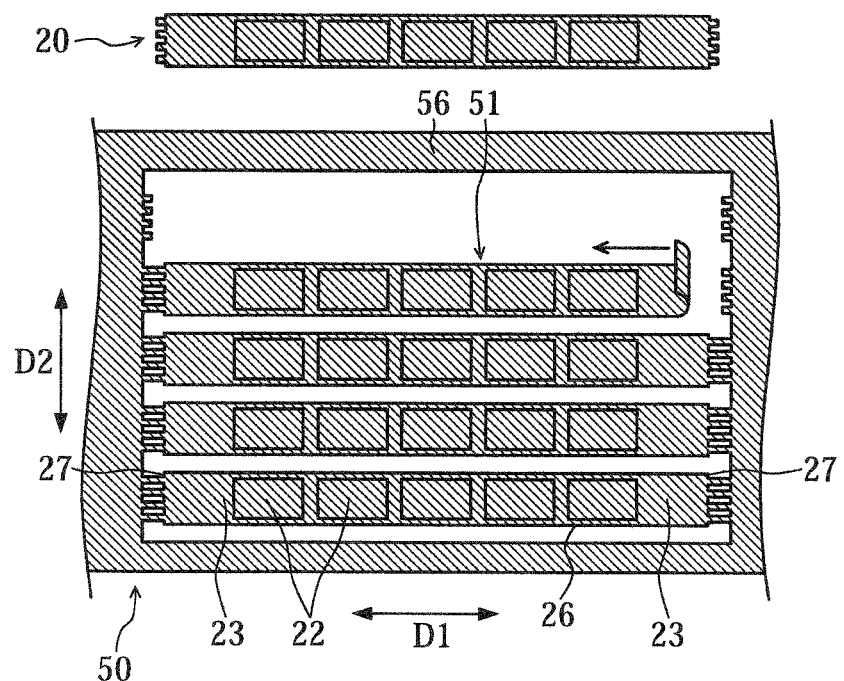
FIG. 23 is a view showing a step of separating a deposition mask portion from a support portion.
Figure 24:
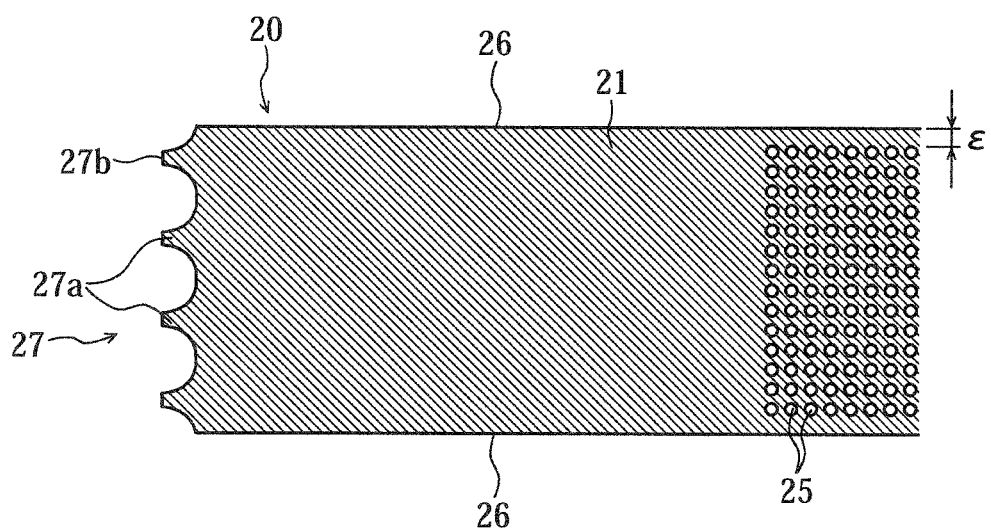
FIG. 24 is an enlarged plan view showing a deposition mask obtained from the intermediate product.

FIG. 23 is a view showing the separation step of separating the deposition mask portion 51 from the support portion 56. As described above, the long side surface 26 of the deposition mask portion 51 and the support portion 56 are not connected. Thus, by breaking the connection portion 54 between the short side surface 27 of the deposition mask portion 51 and the support portion 56, the deposition mask portion 51 can be separated from the support portion 56 so as to obtain the deposition mask 20. FIG. 24 is an enlarged plan view showing the deposition mask 20 obtained from the intermediate product 50.

The separation step includes, for example, a breaking step in which the connection portion 54 in the short side surface 27 of the deposition mask portion 51, which is connected to the support portion 56, is broken. In this case, as shown in FIG. 24, a part of the deposition mask 20 at which the connection portion 54 is broken, e.g., distal ends of the projections 27a of the short side surface 27 become broken-out surfaces 27b. The broke-out surface 27b is a surface including a burr caused by a force exerted from the support portion 56 upon breakage. On the other hand, the long side surface 26 has no broken-out surface.

In FIG. 24, a symbol E represents a minimum distance in the plane direction of the base member 21, which is from the first connection portion 20e at which the long side surface 26 and the first surface 20a are connected, up to the through-hole 25. The distance E is smaller than a minimum distance in the plane direction of the base member 21, which is from the connection portion at which the short side surface 27 and the first surface 20a are connected, up to the through-hole 25. Thus, when the long side surface 26 is deformed to have a wavelike shape, for example, a dimensional precision and/or positional precision of the deposition material 98 adhering to the organic EL substrate 92 through the through-holes 25 positioned near to the long side surface 26 lower. However, in this embodiment, the log side surface 26 is not connected to the support portion 56. Thus, in the separation step of separating the deposition mask portion 51 from the support portion 56, the long side surface 26 is not subjected to a force from the support portion 56. Thus, it can be prevented that the long side surface 26 is deformed to have a wavelike shape, for example. As a result, it is possible to adhere the deposition material 98 to the organic EL substrate 92, with excellent dimensional precision and/or positional precision.

Figure 25:
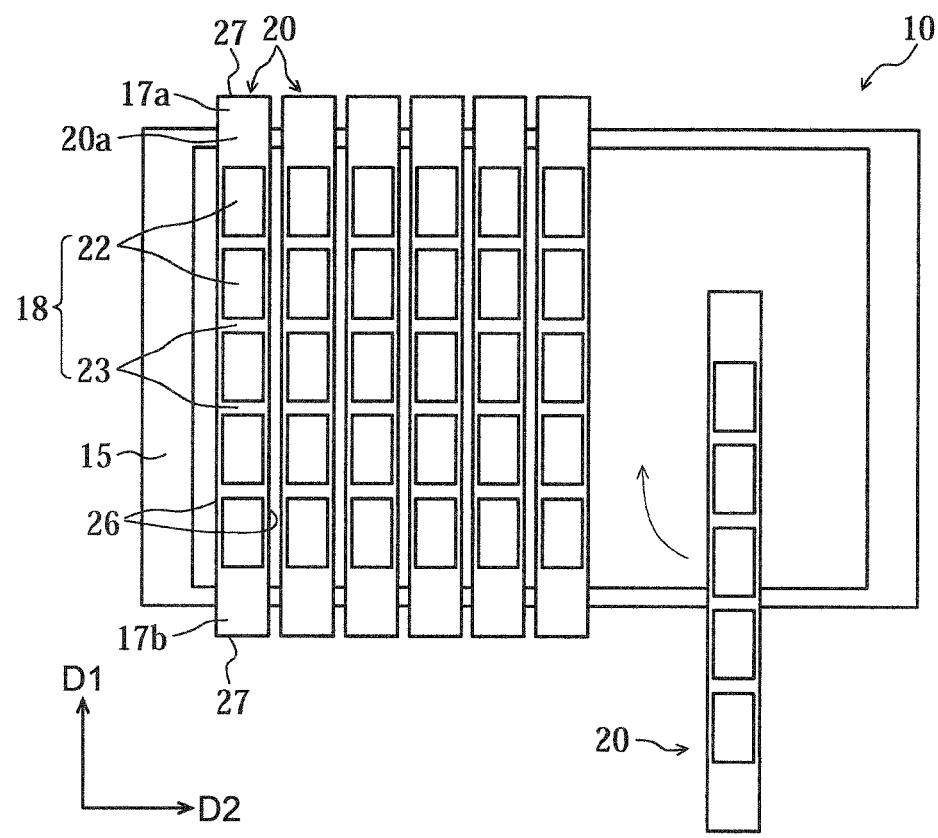
FIG. 25 is a view showing a step of manufacturing a deposition mask apparatus.

Next, a method of manufacturing the deposition mask apparatus 10 by combining the deposition masks 20 and the frame 15. Firstly, the frame 15 is prepared. Following thereto, as shown in FIG. 25, the second surface 20*b* of the deposition mask 20 is fixed on the frame 15 by welding or the like. For example, the frame 15 and the deposition mask 20 are overlapped, and the deposition mask 20 is photographed under this state from the side of the first surface 20*a* by means of a camera, for example. At this time, a tensile force may be applied to the deposition mask 20. After that, based on the photographed image, a position of the deposition mask 20 with respect to the frame 15 is detected. For example, the position of the profile of the deposition mask 20 in the longitudinal direction D1 is detected. Then, the position of the deposition mask 20 is adjusted such that the position of the deposition mask 20 with respect to the frame 15 is placed in a predetermined position.

According to this embodiment, as described above, when the long side surface 26 is seen from the side of the first surface 20*a*, the first portion 261 is invisible. In addition, since the first portion 261 spreads up to the first surface 20*a*, namely, since the first end portion 261*a* of the first portion 261 corresponds to the first connection portion 20*e*, when the long side surface 26 is seen from the side of the first surface 20*a*, a surface of the long side surface 26 other than the first portion 261 is invisible. Thus, the profile of the deposition mask 20 in the longitudinal direction D1 is clearly defined by the first connection portion 20*e* between the first surface 20*a* and the long side surface 26. Thus, the position of the profile of the deposition mask 20 in the longitudinal direction D1 can be easily detected. As a result, the position of the profile of the deposition mask 20 in the longitudinal direction D1 can be more precisely adjusted with respect to the frame 15.

Next, a deposition method for depositing the deposition material 98 onto a substrate such as the organic EL substrate 92 by means of the deposition mask 20 is described. Firstly, the deposition mask apparatus 10 is positioned such that the deposition mask 20 is opposed to the organic EL substrate 92. In addition, the deposition mask 20 is brought into tight contact with the organic EL substrate 92 by using the magnet 93. Under this state, the deposition material 98 is evaporated to reach the organic EL substrate 92 through the deposition mask 20, so that the deposition material 98 can adhere to the organic EL substrate 92 in a pattern corresponding to the through-holes 25 of the deposition mask 20. In this embodiment, as described above, the position of the profile of the deposition mask 20 in the longitudinal direction D1 can be easily detected. Thus, the position of the profile of the deposition mask 20 in the longitudinal direction D1 can be more precisely adjusted with respect to the organic EL substrate 92. As a result, it is possible to adhere the deposition material 98 onto the organic EL substrate 92 with excellent positional precision.

The above-described embodiment can be variously modified. Herebelow, a modification example is described with reference to the drawings according to need. In the below description and the drawings used in the below description, a part that can be similarly constituted to the above embodiment has the same symbol as that of corresponding part the above embodiment, and overlapped description is omitted. In addition, when the effect obtained by the aforementioned embodiment is apparently obtained in the modification examples, description thereof is possibly omitted.

In the above-described embodiment shown in FIG. 20, there is described the example in which the long side surface 26 separated from another portion of the metal plate 64 is formed by causing the second recess 35 formed in the second surface 64*b* of the metal plate 64 to reach the first surface 64*a*. In this modification example, there is described an example in which the long side surface 26 separated from another portion of the metal plate 64 is formed by causing the first recess 30 formed in the first surface 64*a* of the metal plate 64 and the second recess 35 formed in the second surface 64*b* thereof to communicate with each other.

Figure 26:
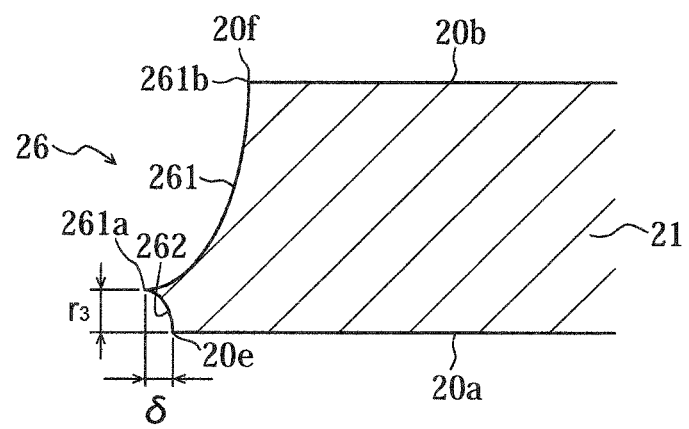
FIG. 26 is a sectional view showing a modification example of a long side surface of the deposition mask.

FIG. 26 is a sectional view showing a long side surface 26 of the deposition mask 20 in this modification example. The long side surface 26 includes a first portion 261, and a second portion 262 connected to a first end portion 261*a* of the first portion 261 to reach the first surface 20*a*. The second portion 262, which is a part of the first recess 30 that is formed by etching the first surface 64*a* of the metal plate 64 in the first-surface etching step, is recessed inside. According to this modification example, by forming the first recess 30 in a portion of the first surface 64*a* of the metal plate 64, which becomes the long side surface 26, even when the metal plate 64 has a large thickness, e.g., even when the metal plate 64 has a thickness of equal to or more than 20 μm or equal to or more than 30 μm, the long side surface 26 can be formed by etching. Although not shown, the short side surface 27 also may include a second portion formed by the first recess 30, and a first portion formed by a second recess 35.

When the long side surface 26 or the short side surface 27 include the second portion along the first surface 64*a*, the first-surface etching step is preferably performed such that a size in the width direction D2 of the first recess 30 formed at a portion the first surface 64*a* of the metal plate 64, which portion becomes the long side surface 26 or the short side surface 27, is smaller than a size in the width direction D2 of the first recess 30 formed in the first surface 64*a* of the metal plate 64, which portion becomes the through-hole 25. Thus, when the metal plate 64 is conveyed to a location where the second-surface etching step is performed after the first-surface etching step, it can be prevented that the metal plate 64 cracks from the first recess 30 corresponding to the long side surface 26 or the short side surface 27.

As shown in FIG. 26, the first end portion 261*a* of the first portion 261 is positioned outside the first connection portion 20*e* at which the first surface 20*a* of the deposition mask 20 and the second portion 262 of the long side surface 26 are connected. Thus, when the deposition mask 20 is seen from the side of the first surface 20*a*, the second portion 262 is visible, but the first portion 261 is invisible. In the second portion 262, light is scattered in various directions. Thus, in the example shown in FIG. 26, the second portion 262 is observed as a portion that seems darker than the first surface 20*a*, or is displayed as such a portion in an image. Thus, the width of the second portion 262 visible from the side of the first surface 20*a* is preferably small. Thus, when the deposition mask 20 is seen from the side of the first surface 20*a*, it is possible to precisely detect the profile of the deposition mask 20, i.e., the profile of the long side surface 26 in the longitudinal direction D.

In FIG. 26, a symbol 8 represents a distance in the plane direction of the first surface 20*a*, which is between the first end portion 261*a* and the first connection portion 20*e*. The distance 8 corresponds to a width of the second portion 262 that is visible when seen from the surface of the first surface 20a. The distance δ is equal to or less than 3.5 μm, for example, or preferably equal to or less than 1.0 μm.

In FIG. 26, a symbol $r_3$ represents a distance in the normal direction of the deposition mask 20, which is from the first surface 20a up to the first end portion 261a. The distance $r_3$ is equal to or less than 2 μm and equal to or more than 5 μm, for example. Thus, since the second portion 262 has a smaller surface area so that scattering of light caused by the second portion 262 can be reduced. Thus, when the second portion 262 is seen from the side of the first surface 20a, the profile of the deposition mask 20, namely, the profile of the long side surface 26 in the longitudinal direction D1 can be more precisely detected. In addition, the distance $r_3$ is preferably smaller than the height $r_1$ of the wall surface 31 of the first recess 30 constituting the through-hole 25. In other words, the first end portion 261a of the long side surface 26 is positioned closer to the first surface 20a than the hole connection portion 41 of the through-hole 25.

In the above-described embodiment, there is described the example in which, in the long side surface 26 of the deposition mask 20, the first connection portion 20e at which the first surface 20a and the long side surface 26 are connected and the first end portion 261a of the first portion 261 correspond to each other, or a distance therebetween is equal to or less than 3.5 μm. Thus, when seen from the first surface 20a, the profile of the deposition mask 20, which extends in the longitudinal direction D1, can be easily detected. Such a technical idea can be applied to the short side surface 27, in addition to the long side surface 26 or instead of the long side surface 26. Namely, although not shown, a connection portion at which the first side surface 20a and the short side surface 27 are connected, and an end portion of a recessed inside surface in the short side surface 27 along the first side surface 20 may correspond to each other, or a distance therebetween may be equal to or less than 3.5 μm. Thus, when seen from the first surface 20a, the profile of the deposition mask 20, namely, the profile of the short side surface 27, which extends in the width direction D2, can be easily detected.

In addition, in the above-described embodiment, there is described the example in which the deposition mask portion 51 is separated from the support portion 56 by breaking the connection portion 54 between the connection mask portion 51 and the support portion 56 in the short side surface 27 of the intermediate product 50. However, the example in which the deposition mask portions 51 are separated from the support portion 56 in the short side surface 27 is not particularly limited. For example, the deposition mask portion 51 may be separated from the support portion 56 by cutting a portion providing the short side surface 27 in the intermediate product 50 by using a processing apparatus such as a laser processing apparatus. In this case, the part providing the short side surface 27 in the metal plate 64 may not be equipped with the plurality of second through-portions 55b. Alternatively, a groove having a depth not passing through the metal plate 64 may be formed in the first surface 64a or the second surface 64b of the part providing the short side surface 27 in the metal plate 64. In this case, by irradiating the metal plate 64 with a laser beam along the groove, a burr caused by the laser processing can be decreased, and/or an amount of cutting dust generated upon laser processing can be reduced.

EXAMPLES

Next, the embodiment of the disclosure is further described in detail based on examples, but the embodiment of the disclosure is not limited to the below description of the examples as long as it departs from the scope of the present invention.

Example 1

Figure 27:
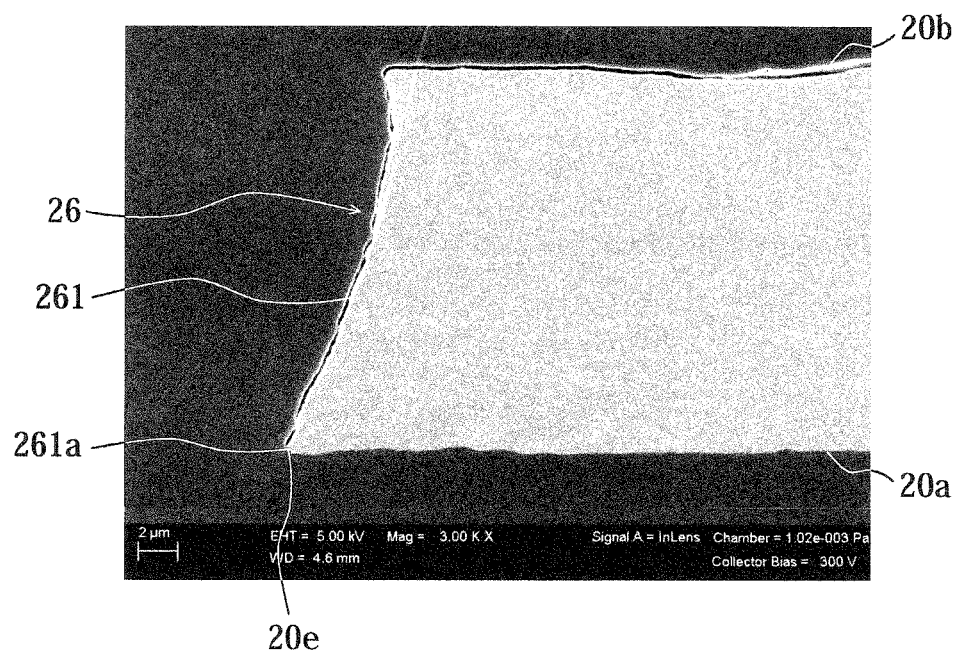
FIG. 27 is a view showing an observation result of a section of a long side surface of a deposition mask according to Example 1.
Figure 28A:
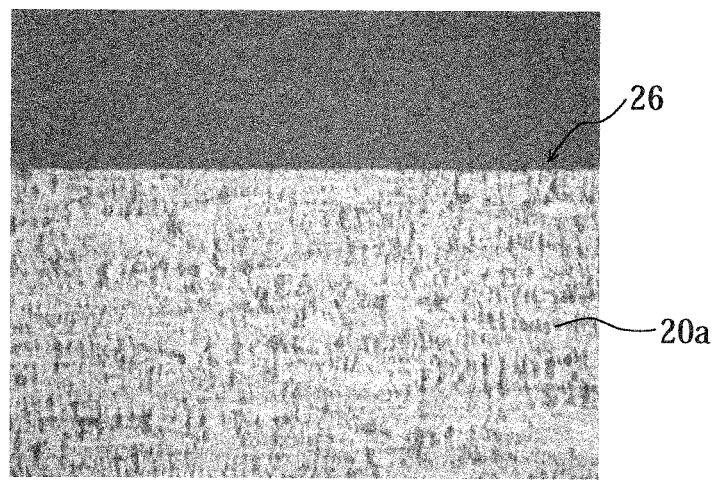
FIG. 28A is a view showing a result of the deposition mask shown in FIG. 27, when observed from the side of the first surface.

The metal plate 64 having a thickness of 25 μm was firstly prepared. Then, the aforementioned processing step was performed so that the plurality of through-holes 25 composed of the first recesses 30 and the second recesses 35 were formed in the metal plate 64. In addition, the second recess 35 reaching the metal plate 64a was formed in a portion of the second surface 64b of the metal plate 64, which portion corresponded to the long side surface 26. FIG. 27 shows an observation result of the section of the long side surface 26. In addition, FIG. 28A shows a result of the deposition mask 20 including the long side surface 26 shown in FIG. 27, when observed from the side of the first surface 20a, and FIG. 28B shows a result observed from the side of the second surface 20b.

Figure 28B:
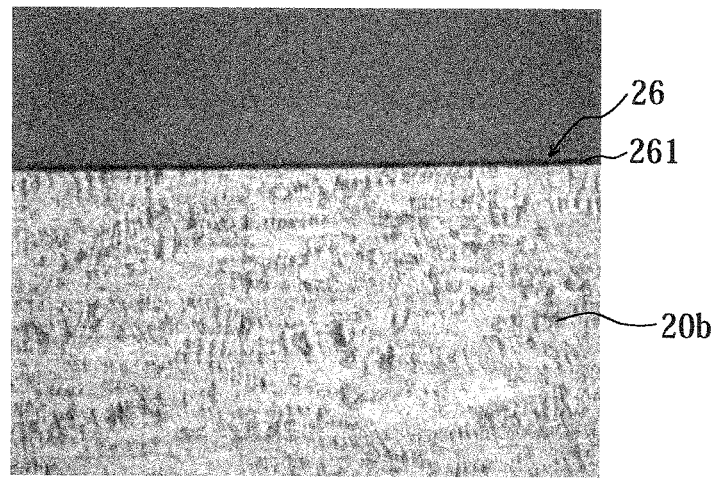
FIG. 28B is a view showing a result of the deposition mask shown in FIG. 27, when observed from the side of the second surface.

As shown in FIG. 28B, when the deposition mask 20 is observed from the side of the second surface 20b, the first portion 261 is visible. On the other hand, when the deposition mask 20 is observed from the side of the first surface 20a, the first portion is invisible. Thus, the position of the profile of the deposition mask 20 in the longitudinal direction D1 can be easily detected.

Example 2

Figure 29A:
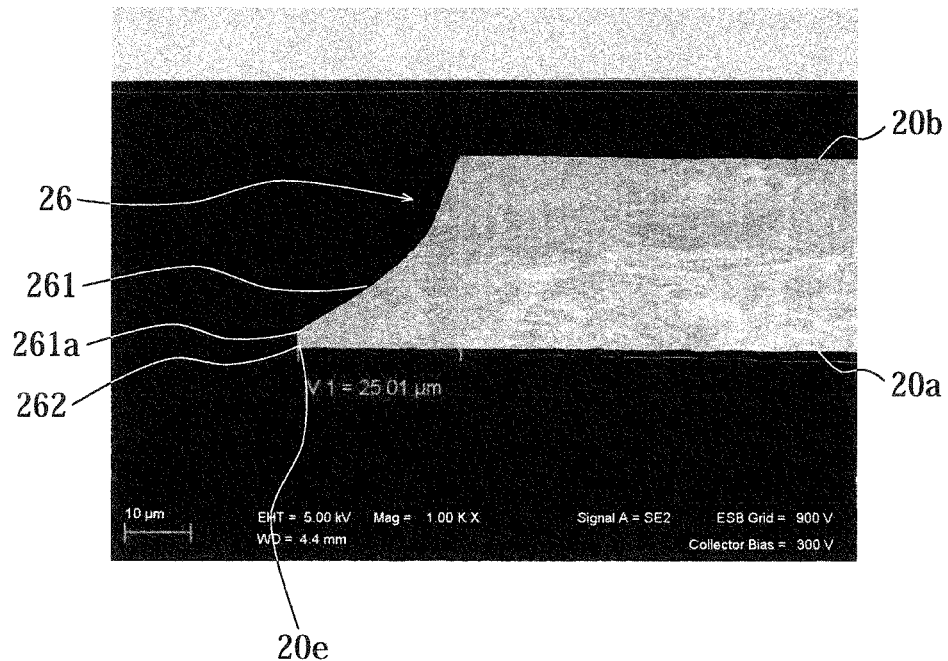
FIG. 29A is a view showing an observation result of a section of a long side surface of a deposition mask according to Example 2.

The metal plate 64 having a thickness of 30 μm was prepared. Then, the aforementioned processing step was performed so that the plurality of through-holes 25 composed of the first recesses 30 and the second recesses 35 were formed in the metal plate 64. In addition, the first recess 30 was formed in a portion of the first surface 64a of the metal plate 64, which portion corresponded to the long side surface 26, and the second recess 35 in communication with the first recess 30 was formed in a portion of the second surface 64b, which portion corresponded to the long side surface 26. FIG. 29A shows an observation result of the section of the long side surface 26. The long side surface 26 includes the first portion 261 formed of a part of the second recess 35, and the second portion 262 formed of a part of the first recess 30.

Figure 29B:
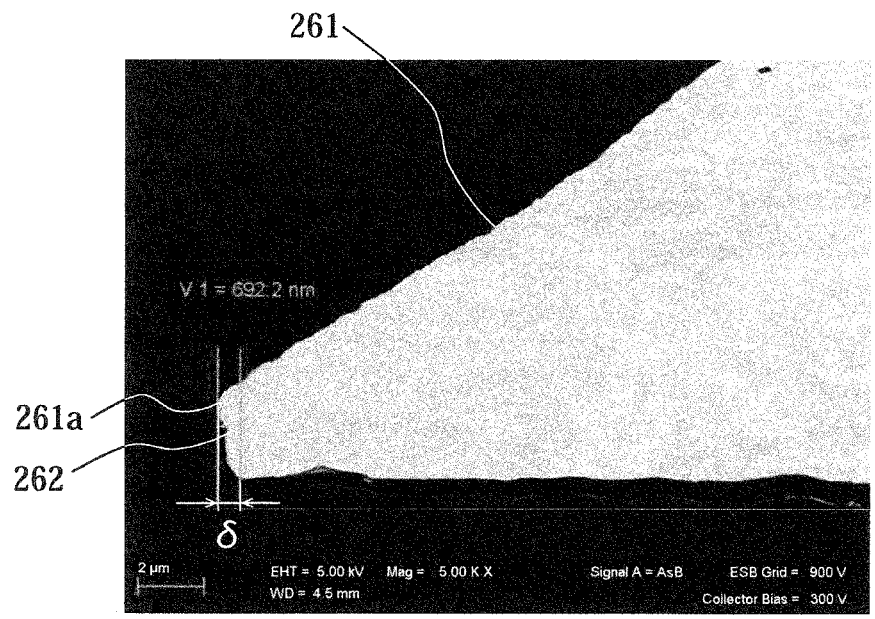
FIG. 29B is an enlarged sectional view showing a second portion of the long side surface shown in FIG. 29A.

FIG. 29B is an enlarged sectional view showing the second portion 262 of the long side surface 26 of FIG. 29A. A distance δ between the first end portion 261a and the first connection portion 20e was 0.7 μm.

When the deposition mask 20 including the long side surface 26 shown in FIGS. 29A and 29B is seen from the side of the second surface 20b, the first portion 261 is visible. On the other hand, when the same deposition mask 20 is seen from the side of the first surface 20a, the first portion 261 is invisible but the second portion 262 is visible. Since the distance δ between the first end portion 261a and the first connection portion 20e is 0.7 μm, a width of the second portion 262 that is visible when the deposition mask 20 is observed from the side of the first surface 20a is also 0.7 μm. Thus, even when the deposition mask 20 is observed by using a camera from the side of the first surface 20a in a state where a visual field size of the camera in the width direction D2 is enlarged to be about 3.5 μm, both the first end portion 261a and the first connection portion 20e can be confirmed. Thus, the profile of the deposition mask 20 can be easily detected.

Example 3

Figure 30:
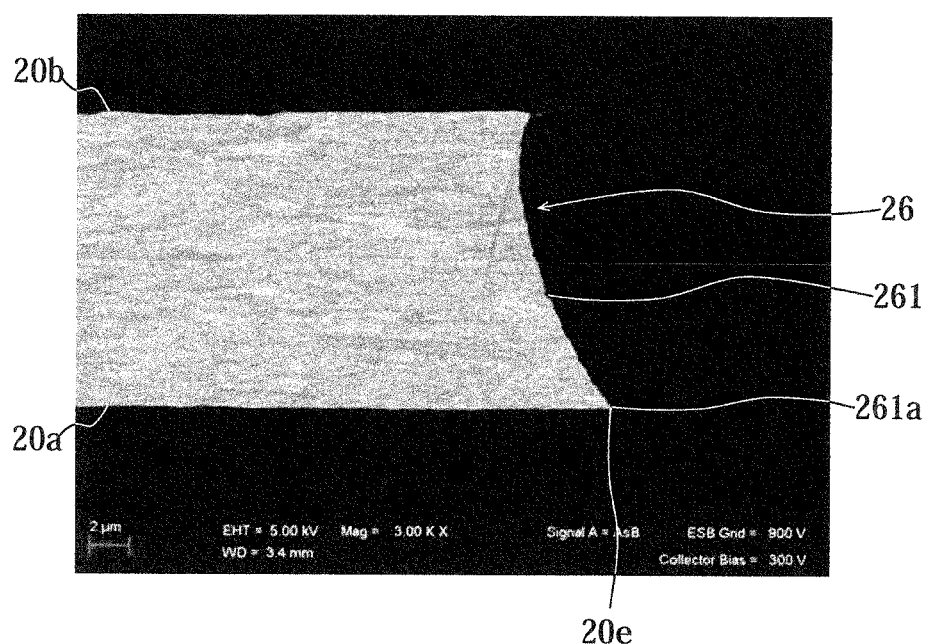
FIG. 30 is a view showing an observation result of a section of a long side surface of a deposition mask according to Example 3.

The deposition mask 20 was manufactured similarly to the aforementioned Example 1, excluding that the metal plate 641 having a thickness of 15 µm was used. FIG. 30 shows an observation result of the section of the long side surface 26. As shown in FIG. 27, also in this example, similarly to the Example 1, the first portion 261 formed of a curved surface that is curved to be recessed inside spreads from the second surface 20*b* up to the first surface 20*a*. In this case, the first end prion 261*a* of the first portion 261 corresponds to the first connection portion 20*e*. Thus, when the deposition mask 20 is seen from the side of the first surface 20*a*, the first portion 261 is invisible. Thus, when the deposition mask 20 is seen along the normal direction of the first surface 20*a*, the position of the profile of the deposition mask 20 in the longitudinal direction D1 can be easily detected.

The invention claimed is:

1. A deposition mask in which a plurality of through-holes are formed, comprising:
 a first surface and a second surface, in which the plurality of through-holes are formed;
 a pair of long side surfaces connected to the first surface and the second surface, and defining a profile of the deposition mask in a longitudinal direction of the deposition mask; and
 a pair of short side surfaces connected to the first surface and the second surface, and defining a profile of the deposition mask in a width direction of the deposition mask;
 wherein the through-hole includes a first recess formed the first surface, and a second recess formed the second surface and connected to the first recess through a hole connection portion;
 wherein the first recess includes a wall surface extending from the hole connection portion to the first surface, the second recess includes a wall surface extending from the hole connection portion to the second surface, a height of the wall surface of the first recess is smaller than the height of the wall surface of the second recess, and the height of the wall surface of the first recess is equal to or less than 6 µm,
 wherein each of the long side surfaces includes a first portion that is recessed inside, the first position including a first end portion positioned along the first surface, and a second end portion positioned along the second surface and positioned inside the first end portion; and
 wherein the first end portion corresponds to a first connection portion to which the first surface and the long side surface are connected, the first connection portion being positioned at a same plane with the first surface.

2. The deposition mask according to claim 1, wherein the first portion is positioned inside a virtual plane or line, the virtual plane or line passing the first end portion and the second end portion.

3. The deposition mask according to claim 1, wherein a thickness of the deposition mask is equal to or less than 50 µm.

4. The deposition mask according to claim 1, wherein the second end portion corresponds to a second connection portion to which the second surface and the long side surface are connected, the second connection portion being positioned at a same plane with the second surface.

5. A manufacturing method of a deposition mask in which a plurality of through-holes are formed, comprising:
 a step of preparing a metal plate including a first surface and a second surface opposite to the first surface; and
 a processing step of processing the metal plate to obtain the deposition mask which includes a first surface and a second surface in which the plurality of through-holes are formed, a pair of long side surfaces connected to the first surface and the second surface, and defining a profile of the deposition mask in a longitudinal direction of the deposition mask, and a pair of short side surfaces connected to the first surface and the second surface, and defining a profile of the deposition mask in a width direction of the deposition mask;
 wherein the through-hole includes a first recess formed the first surface, and a second recess formed the second surface and connected to the first recess through a hole connection portion;
 wherein the first recess includes a wall surface extending from the hole connection portion to the first surface, the second recess includes a wall surface extending from the hole connection portion to the second surface, a height of the wall surface of the first recess is smaller than the height of the wall surface of the second recess, and the height of the wall surface of the first recess is equal to or less than 6 µm,
 wherein each of the long side surfaces includes a first portion that is recessed inside, the first portion including a first end portion positioned along the first surface, and a second end portion positioned along the second surface and positioned inside the first end portion;
 wherein the through-hole includes a first recess formed on the first surface, and a second recess formed on the second surface and connected to the first recess through a hole connection portion; and
 wherein the first end portion of the first portion of the long side surface is positioned closer to the first surface than the hole connection portion.

6. The manufacturing method according to claim 5, wherein the processing step includes a second-surface etching step of etching the metal plate along the second surface so as to form the first portion of the long side surface; and
 wherein the second-surface etching step is performed such that the first end portion of the first portion corresponds to a first connection portion to which the first surface and the long side surface are connected, the first connection portion being positioned at a same plane with the first surface.

7. The manufacturing method according to claim 5, the processing step including:
 a first-surface etching step of etching the metal plate along the first surface so as to form a second portion of the long side surface; and
 a second-surface etching step of etching the metal plate along the second surface so as to form the first portion of the long side surface,
 the second portion being positioned between the first end portion of the first portion of the long side surface and the first surface of the metal plate.

8. The manufacturing method according to claim 5, wherein a distance between a first connection portion and the first end portion of the first portion of the long side surface in a plane direction of the first surface is equal to or less than 3.5 µm, the first connection portion being positioned at a same plane with the first surface and connecting the first surface and the long side surface.

9. A manufacturing method of a deposition mask in which a plurality of through-holes are formed, comprising:

a step of preparing a metal plate including a first surface and a second surface opposite to the first surface; and a processing step of processing the metal plate to obtain the deposition mask which includes a first surface and a second surface in which the plurality of through-holes are formed, a pair of long side surfaces connected to the first surface and the second surface, and defining a profile of the deposition mask in a longitudinal direction of the deposition mask, and a pair of short side surfaces connected to the first surface and the second surface, and defining a profile of the deposition mask in a width direction of the deposition mask;

wherein the through-hole includes a first recess formed the first surface, and a second recess formed the second surface and connected to the first recess through a hole connection portion;

wherein the first recess includes a wall surface extending from the hole connection portion to the first surface, the second recess includes a wall surface extending from the hole connection portion to the second surface, a height of the wall surface of the first recess is smaller than the height of the wall surface of the second recess, and the height of the wall surface of the first recess is equal to or less than 6 µm, wherein each of the long side surfaces includes a first portion that is recessed inside, the first portion including a first end portion positioned along the first surface, and a second end portion positioned along the second surface and positioned inside the first end portion;

wherein the processing step includes a second-surface etching step of etching the metal plate along the second surface so as to form the first portion of the long side surface; and wherein the second-surface etching step is performed such that the first end portion of the first portion corresponds to a first connection portion to which the first surface and the long side surface are connected, the first connection portion being positioned at a same plane with the first surface.

* * * * *